(12) United States Patent
Do et al.

(10) Patent No.: US 11,450,376 B2
(45) Date of Patent: Sep. 20, 2022

(54) WORD LINE DRIVER CIRCUITS FOR MEMORY DEVICES AND METHODS OF OPERATING SAME

(71) Applicant: Samsung Electronics Co., Ltd., Suwon-si (KR)

(72) Inventors: Sunggeun Do, Seongnam-si (KR); Youngsik Kim, Gunpo-si (KR); Gongheum Han, Hwaseong-si (KR); Sangyun Kim, Hwaseong-si (KR); Seunghyun Cho, Jinju-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/038,488

(22) Filed: Sep. 30, 2020

(65) Prior Publication Data

US 2021/0225425 A1 Jul. 22, 2021

(30) Foreign Application Priority Data

Jan. 20, 2020 (KR) .................. 10-2020-0007388

(51) Int. Cl.
| | | |
|---|---|---|
| *G11C 11/408* | (2006.01) | |
| *G11C 5/06* | (2006.01) | |
| *G11C 11/406* | (2006.01) | |
| *G11C 11/4074* | (2006.01) | |

(52) U.S. Cl.
CPC ............ *G11C 11/4085* (2013.01); *G11C 5/06* (2013.01); *G11C 11/4074* (2013.01); *G11C 11/40615* (2013.01)

(58) Field of Classification Search
CPC .......... G11C 11/4085; G11C 11/40615; G11C 11/4074; G11C 5/06

USPC ..................................................... 365/185.23
See application file for complete search history.

(56) References Cited

U.S. PATENT DOCUMENTS

| | | | |
|---|---|---|---|
| 5,812,483 A | 9/1998 | Jeon et al. | |
| 6,115,319 A * | 9/2000 | Kinoshita | G11C 8/08 365/189.11 |
| 6,236,617 B1 | 5/2001 | Hsu et al. | |
| 6,680,875 B2 | 1/2004 | Horiguchi et al. | |
| 6,731,540 B2 * | 5/2004 | Lee | G11C 16/08 365/185.11 |
| 6,813,216 B2 | 11/2004 | Lee | |

(Continued)

FOREIGN PATENT DOCUMENTS

| | | |
|---|---|---|
| KR | 100801059 B1 | 2/2008 |
| TW | 498345 B | 8/2002 |
| TW | 201801075 A | 1/2018 |

*Primary Examiner* — Connie C Yoha
(74) *Attorney, Agent, or Firm* — Myers Bigel, P.A.

(57) ABSTRACT

A memory device includes a word line driver circuit, which can advantageously reduce gate stress on a transistor using a lower high voltage that varies with a command, and an operating method of the memory device. The memory device includes a plurality of memory blocks, provides a high voltage or the lower high voltage to a variable high voltage line in response to a block select signal, and changes a level of the lower high voltage to a low voltage level, a medium voltage level, or a high voltage level based on the command. The memory device applies the lower high voltage to gates of P-type metal oxide semiconductor (PMOS) transistors connected to a word line driving signal, which drives word lines of non-selected memory blocks among the plurality of memory blocks.

17 Claims, 16 Drawing Sheets

(56) References Cited

U.S. PATENT DOCUMENTS

| | | |
|---|---|---|
| 6,953,960 B2 | 10/2005 | Tomishima |
| 7,545,701 B2 | 6/2009 | Min et al. |
| 7,646,653 B2 | 1/2010 | Choi et al. |
| 7,692,977 B2 * | 4/2010 | Kim .................. G11C 16/3454 |
| | | 365/185.25 |
| 8,050,071 B2 | 11/2011 | Yu et al. |
| 2005/0068832 A1 | 3/2005 | Andoh |
| 2014/0347951 A1 | 11/2014 | Kim |
| 2017/0365325 A1 | 12/2017 | Murakami |
| 2018/0211700 A1 * | 7/2018 | Kamata ............... G11C 11/4097 |

* cited by examiner

WORD LINE DRIVER CIRCUITS FOR MEMORY DEVICES AND METHODS OF OPERATING SAME

REFERENCE TO PRIORITY APPLICATION

This application claims the benefit of Korean Patent Application No. 10-2020-0007388, filed Jan. 20, 2020, the disclosure of which is hereby incorporated herein by reference.

BACKGROUND

The inventive concept relates to a memory device and, more particularly, to a word line driver circuit for reducing gate stress on a transistor driving a word line of a memory device and an operating method of the memory device.

With the development of high capacity of memory devices, such as dynamic random access memory (DRAM) devices, the size of metal oxide semiconductor (MOS) transistors integrated into the DRAM devices and the thickness of gate oxide films have been decreased. DRAM devices include memory cells, and each memory cell includes a cell transistor and a cell capacitor. DRAM devices operate by writing and reading data according to charges stored in the cell capacitor. The cell transistor is typically an N-type MOS (NMOS) transistor, and a gate of the cell transistor is connected to one of a plurality of word lines arranged in a row direction across a memory cell array. An end of the cell transistor is connected to one of the bit lines arranged in a column direction of the memory cell array, and the other end of the cell transistor is connected to the cell capacitor.

DRAM devices can include a word line driver circuit, which drives a word line using a high voltage greater than a power supply voltage to turn on an NMOS cell transistor. When a high voltage is applied to a gate of a transistor included in the word line driver circuit, stress such as strong electric fields may be applied to the gate of the transistor. The characteristics of the transistor may be changed by the gate stress on the transistor, thereby decreasing the reliability of the word line driver circuit.

SUMMARY

The inventive concept provides a memory device having a word line driver circuit therein, which reduces gate stress on a transistor by using a lower high voltage varying with a command, and a method of operating the memory device.

According to an aspect of the inventive concept, there is provided a memory device capable of operating in an operating mode according to a command. The memory device includes a memory cell array including a plurality of memory blocks, with each of the memory blocks including a plurality of memory cells connected to word lines and bit lines, which are arranged in rows and columns, and configured to operate in the operating mode in response to a block select signal. A voltage generator circuit is provided, which is configured to generate a lower high voltage based on a high voltage and to provide the high voltage or the lower high voltage to a variable high voltage line. According to some embodiments, the high voltage has a higher level than a power supply voltage of the memory device and the lower high voltage has a lower level than the high voltage. A word line driver circuit is provided, which is connected to the variable high voltage line and configured to: (i) drive a first word line driving signal line to a ground voltage, (ii) drive second word line driving signal lines to the high voltage, and (iii) drive third word line driving signal lines to the lower high voltage. The first word line driving signal line is connected to an enabled word line among the word lines of the selected memory block. The second word line driving signal lines are connected to disabled word lines among the word lines. And, the third word line driving signal lines are connected to the word lines of non-selected memory blocks among the plurality of memory blocks.

According to another aspect of the inventive concept, there is provided an operating method of a memory device, for driving word lines of a plurality of memory blocks to different levels according to a command. Each of the plurality of memory blocks includes a plurality of memory cells connected to word lines and bit lines arranged in rows and columns. The operating method includes: (i) receiving the command, (ii) generating a lower high voltage based on the command (the lower high voltage having a level lower than a level of a high voltage of the memory device), (iii) providing the high voltage or the lower high voltage to a variable high voltage line in response to a block select signal of the plurality of memory blocks (the variable high voltage line driving word line driving signal lines connected to the word lines of the plurality of memory blocks), (iv) driving a first word line driving signal line to a ground voltage and second word line driving signal lines to the high voltage through the variable high voltage line (the first word line driving signal line being connected to an enabled word line among the word lines of a memory block selected from the plurality of memory blocks in response to the block select signal and the second word line driving signal lines being connected to disabled word lines among the word lines), and (v) driving third word line driving signal lines to the lower high voltage through the variable high voltage line (the third word line driving signal lines being connected to the word lines of non-selected memory blocks among the plurality of memory blocks).

According to a further aspect of the inventive concept, there is provided a word line driver circuit driving word lines of a plurality of memory blocks. The word line driver circuit includes: (i) a first word line driving signal generator circuit configured to generate a first word line driving signal based on a first row address signal in response to a mode control signal, (ii) a second word line driving signal generator circuit configured to generate a second word line driving signal based on the mode control signal and a second row address signal, and (iii) a third word line driving signal generator circuit connected to a variable high voltage line and configured to generate a third word line driving signal based on the first word line driving signal and the second word line driving signal (the variable high voltage line being provided with different voltage levels according to a command and the third first word line driving signal driving the word lines).

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
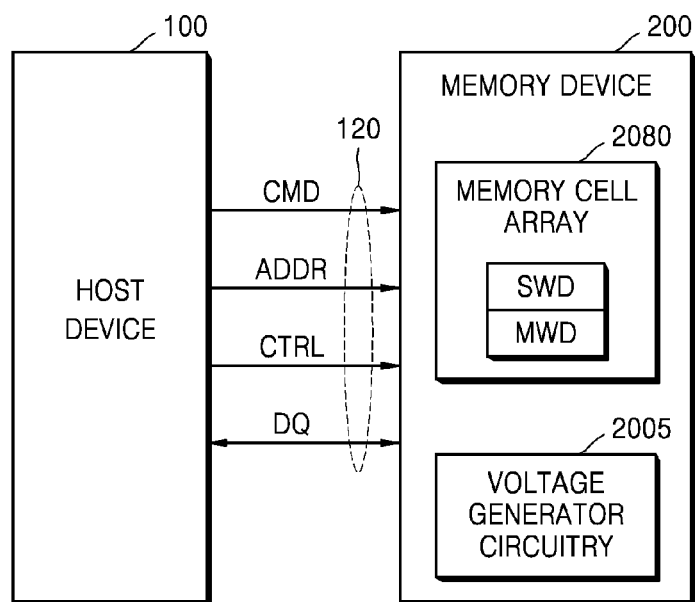
FIG. 1 is a diagram for describing a system including a memory device, according to embodiments.

Hereinafter, embodiments will be described in detail with reference to the accompanying drawings. In the drawings, like elements are denoted by like reference numerals or characters. A suffix of a reference numeral or character (e.g., 1 in BLK1 or "i" in 730i) is used to distinguish from each other circuits having the same functions. Some embodiments may be described using terms "connected" and/or "coupled" together with derivatives thereof. These terms are not intended to be synonyms. For example, descriptions using the terms "connected" and/or "coupled" may express that at least two elements are in direct contact with each other physically or electrically. In addition, terms "connection" and/or "coupling" may indicate that at least two elements are not in direct contact with each other but cooperate or interact with each other.

FIG. 1 is a diagram for describing a system including a memory device, according to embodiments. Referring to FIG. 1, a system 10 may include a host device 100 and a memory device 200. The host device 100 may be communicatively connected to the memory device 200 through a memory bus 120.

The host device 100 may include a computing system such as a computer, a server, a work station, a portable communication terminal, a personal digital assistant (PDA), a portable multimedia player (PMP), a smart phone, or a wearable device. Alternatively, the host device 100 may form some of elements included in a computing system such as a graphics card. As a function block performing general computing operations in the system 10, the host device 100 may correspond to a central processing unit (CPU), a digital signal processor (DSP), a graphics processing unit (GPU), or an application processor (AP).

The memory bus 120 may include signal lines, which transmit a command CMD, an address ADDR, and control signals CTRL, and data lines, which transmit input/output (I/O) data DQ. Although a single line is shown for the same kind of signals transferred between the host device 100 and the memory device 200 for the brevity of the drawings, a plurality of lines may be connected between the host device 100 and the memory device 200.

The memory device 200 may write or read the I/O data DQ under the control of the host device 100. For example, the memory device 200 may include a dynamic random access memory (DRAM) device. However, embodiments are not limited thereto. The memory device 200 may include a volatile memory device such as synchronous DRAM (SDRAM), double data rate (DDR) SDRAM, low power DDR (LPDDR) SDRAM, graphics DDR (GDDR) SDRAM, DDR2 SDRAM, DDR3 SDRAM, DDR4 SDRAM, DDR5 SDRAM, wide I/O DRAM, high bandwidth memory (HBM), or hybrid memory cube (HMC).

The memory device 200 may include a memory cell array 2080, which includes a plurality of memory blocks, and a voltage generator circuitry 2005 (in FIG. 7), which provides a variable high voltage VX to word line drivers driving word lines. In each of the memory blocks, a plurality of memory cells are connected to word lines and bit lines, which are arranged in rows and columns. The voltage generator circuitry 2005 may generate a lower high voltage VPPIB, which has a lower level than a high voltage VPP, based on the high voltage VPP having a higher level than a power supply voltage and may provide the high voltage VPP or the lower high voltage VPPIB to the line of the variable high voltage VX. The voltage generator circuitry 2005 may change the level of the lower high voltage VPPIB based on the command CMD received from the memory device 200. The lower high voltage VPPIB may be changed to a low voltage level LVL, a medium voltage level MVL, or a high voltage level HVL (in FIG. 11).

Figure 2:
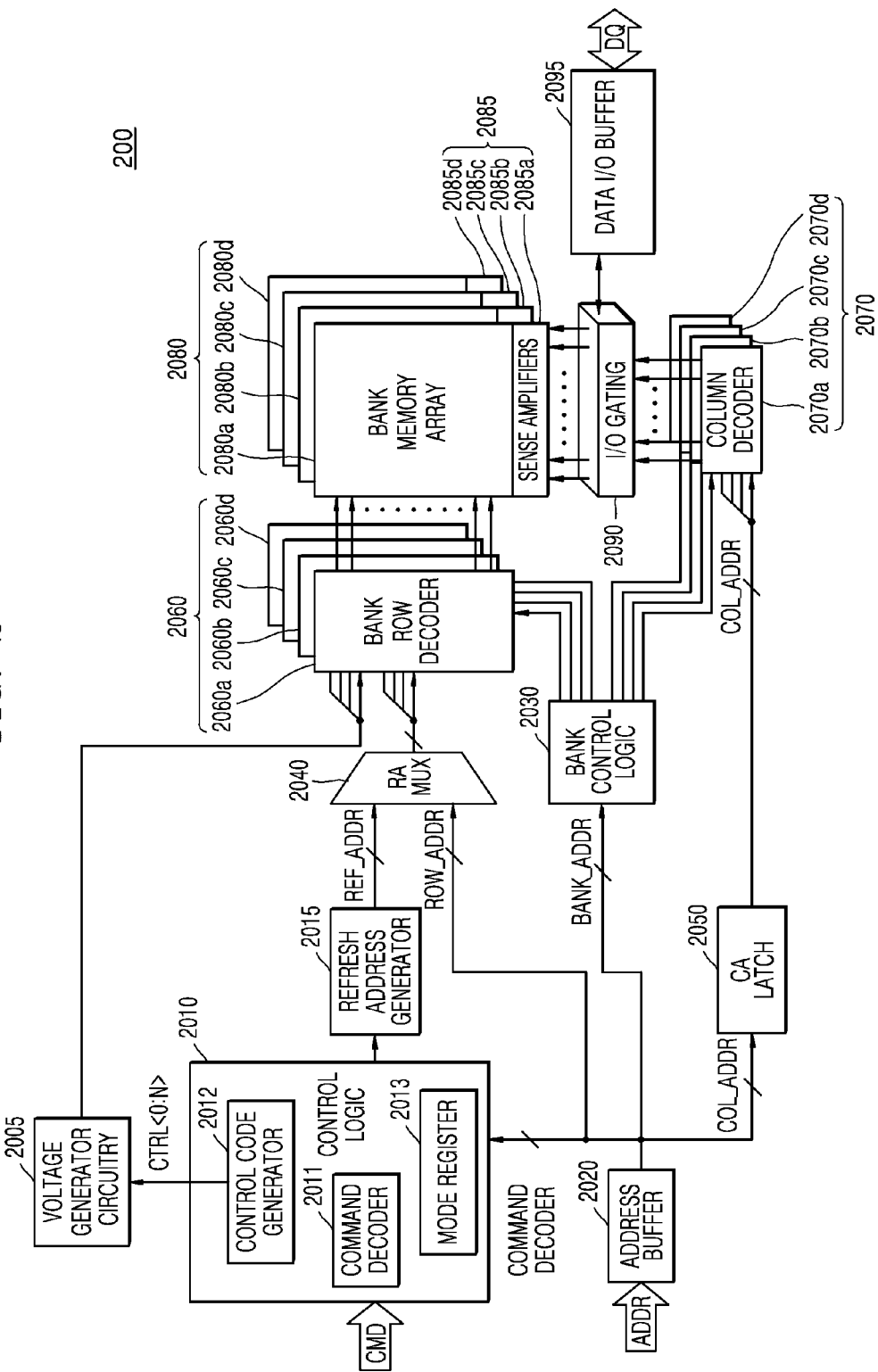
FIG. 2 is a block diagram illustrating the configuration of the memory device in FIG. 1, according to embodiments.

FIG. 2 is a block diagram illustrating the configuration of the memory device 200 in FIG. 1, according to embodiments. In the present embodiment, the case where the memory device 200 includes DRAM will be described, such that the memory device 200 will be referred to as a DRAM 200.

Referring to FIG. 2, the DRAM 200 may include voltage generator circuitry 2005, a control logic 2010, a refresh address generator 2015, an address buffer 2020, a bank control logic 2030, a row address multiplexer (RA MUX) 2040, a column address (CA) latch 2050, a row decoder 2060, a column decoder 2070, a memory cell array 2080, a sense amplifier unit 1085, an I/O gating circuitry 2090, and a data I/O buffer 2095.

The memory cell array 2080 may include first through fourth bank memory arrays 2080a, 2080b, 2080c, and 2080d. Each of the first through fourth bank arrays 2080a, 2080b, 2080c, and 2080d may include a plurality of word lines, a plurality of bit lines, and a plurality of memory cells formed at the intersections between the word lines and the bit lines.

The row decoder 2060 may include first through fourth bank row decoders 2060a, 2060b, 2060c, and 2060d respectively connected to the first through fourth bank arrays 2080a, 2080b, 2080c, and 2080d. The column decoder 2070 may include first through fourth bank column decoders 2070a, 2070b, 2070c, and 2070d respectively connected to the first through fourth bank arrays 2080a, 2080b, 2080c, and 2080d. The sense amplifier unit 1085 may include first through fourth bank sense amplifiers 2085a, 2085b, 2085c, and 2085d respectively connected to the first through fourth bank arrays 2080a, 2080b, 2080c, and 2080d.

The first through fourth bank arrays 2080a, 2080b, 2080c, and 2080d, the first through fourth bank row decoders 2060a, 2060b, 2060c, and 2060d, the first through fourth bank column decoders 2070a, 2070b, 2070c, and 2070d, and the first through fourth bank sense amplifiers 2085a, 2085b, 2085c, and 2085d may respectively form first through fourth memory banks. Although the memory device 200 includes four memory banks in the present embodiment, the memory device 200 may include a random number of memory banks according to embodiments.

The control logic 2010 may control all operations of the memory device 200. The control logic 2010 may generate control signals such that the memory device 200 performs a write operation or a read operation. The control logic 2010 may include a command decoder 2011, which decodes the command CMD received from the host device 100, and a mode register 2013, which sets an operating mode of the memory device 200. The command decoder 2011 may decode a write enable signal/WE, a row address strobe signal/RAS, a column address strobe signal/CAS, a chip select signal/CS, and so on and generate control signals corresponding to the command CMD. The mode register 2013 may provide a plurality of operation options of the memory device 200 and may program various functions, properties, and modes of the memory device 200.

The control logic 2010 may include a control code generator 2012, which generates a control code CTRL<0:N> based on the command CMD. The control code CTRL<0:N> may be provided to the voltage generator circuitry 2005 generating a lower high voltage. The voltage generator circuitry 2005 may change the level of the lower high voltage VPPIB (in FIG. 7) based on the control code CTRL<0:N>. The lower high voltage VPPIB may have a low voltage level LVL (in FIG. 11), a medium voltage level MVL (in FIG. 11), or a high voltage level HVL (in FIG. 11).

The control logic 2010 may control the refresh address generator 2015 to perform an auto-refresh operation in response to a refresh command or to perform a self-refresh operation in response to a self-refresh entry command. The refresh address generator 2015 may generate a refresh address REF_ADDR, which corresponds to a memory cell row to undergo a refresh operation. The refresh address generator 2015 may generate the refresh address REF_ADDR with a refresh period defined in volatile memory standards.

The address buffer 2020 may receive the address ADDR, which includes a bank address BANK_ADDR, a row address ROW_ADDR, and a column address COL_ADDR, from a memory controller. The address buffer 2020 may provide the bank address BANK_ADDR to the bank control logic 2030, the row address ROW_ADDR to the row address multiplexer 2040, and the column address COL_ADDR to the column address latch 2050.

The bank control logic 2030 may generate bank control signals in response to the bank address BANK_ADDR. In response to the bank control signals, a bank row decoder corresponding to the bank address BANK_ADDR among the first through fourth bank row decoders 2060a, 2060b, 2060c, and 2060d may be activated, and a bank column decoder corresponding to the bank address BANK_ADDR among the first through fourth bank column decoders 2070a, 2070b, 2070c, and 2070d may be activated.

The row address multiplexer 2040 may receive the row address ROW_ADDR from the address buffer 2020 and the refresh address REF_ADDR from the refresh address generator 2015. The row address multiplexer 2040 may selectively output the row address ROW_ADDR or the refresh address REF_ADDR. A row address output from the row address multiplexer 2040 may be applied to the first through fourth bank row decoders 2060a, 2060b, 2060c, and 2060d.

Among the first through fourth bank row decoders 2060a, 2060b, 2060c, and 2060d, a bank row decoder activated by the bank control logic 2030 may decode the row address output from the row address multiplexer 2040 and activate a word line corresponding to the row address. For example, the activated bank row decoder may apply a word line driving voltage to a word line corresponding to the row address.

The column address latch 2050 may receive the column address COL_ADDR from the address buffer 2020 and temporarily store the column address COL_ADDR. The column address latch 2050 may gradually increase the column address COL_ADDR received in a burst mode. The column address latch 2050 may apply the column address COL_ADDR, which has been temporarily stored or gradually increased, to the first through fourth bank column decoders 2070a, 2070b, 2070c, and 2070d.

Among the first through fourth bank column decoders 2070a, 2070b, 2070c, and 2070d, a bank column decoder activated by the bank control logic 2030 may activate a sense amplifier, which corresponds to the bank address BANK_ADDR and the column address COL_ADDR, through the I/O gating circuitry 2090.

The I/O gating circuitry 2090 may include circuits gating the I/O data DQ; an input data mask logic; read data latches storing data read from the first through fourth bank arrays 2080a, 2080b, 2080c, and 2080d; and a write driver writing data to the first through fourth bank arrays 2080a, 2080b, 2080c, and 2080d.

Data read from one of the first through fourth bank arrays 2080a, 2080b, 2080c, and 2080d may be sensed by sense amplifiers corresponding to the one of the first through fourth bank arrays 2080a, 2080b, 2080c, and 2080d and may be stored in the read data latches. Data to be written to a memory cell array of one of the first through fourth bank arrays 2080a, 2080b, 2080c, and 2080d may be provided from a memory controller to the data I/O buffer 2095. The data provided to the data I/O buffer 2095 may be written to one of the first through fourth bank arrays 2080a, 2080b, 2080c, and 2080d through the write driver.

During a wafer-level test, the data I/O buffer 2095 may receive, as the I/O data DQ, a test pattern signal from a tester and provide the test pattern signal to the I/O gating circuit 2090. During the wafer-level test, the I/O gating circuit 2090 may write the test pattern signal to a target page of the memory cell array 2080, may read the test pattern signal from the target page, and may provide the test pattern signal as a test result signal to the data I/O buffer 2095. The data I/O buffer 2095 may output the test result signal as the I/O data DQ.

Figure 3:
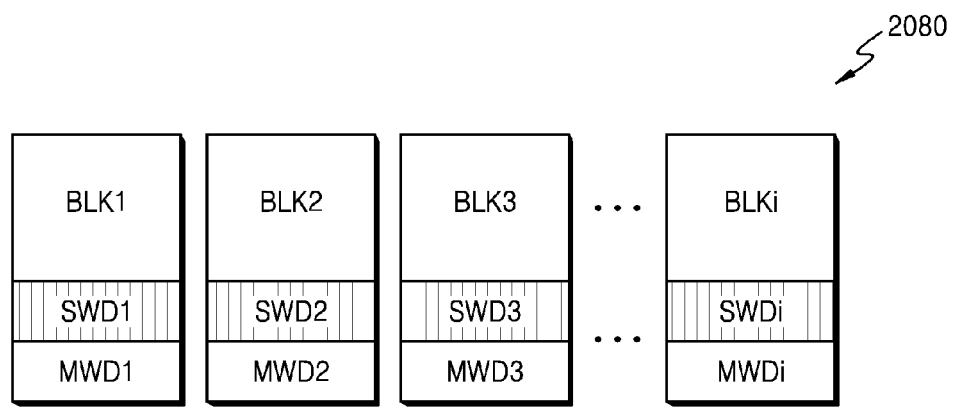
FIGS. 3 and 4 are diagrams for describing a memory bank in FIG. 2.
Figure 4:
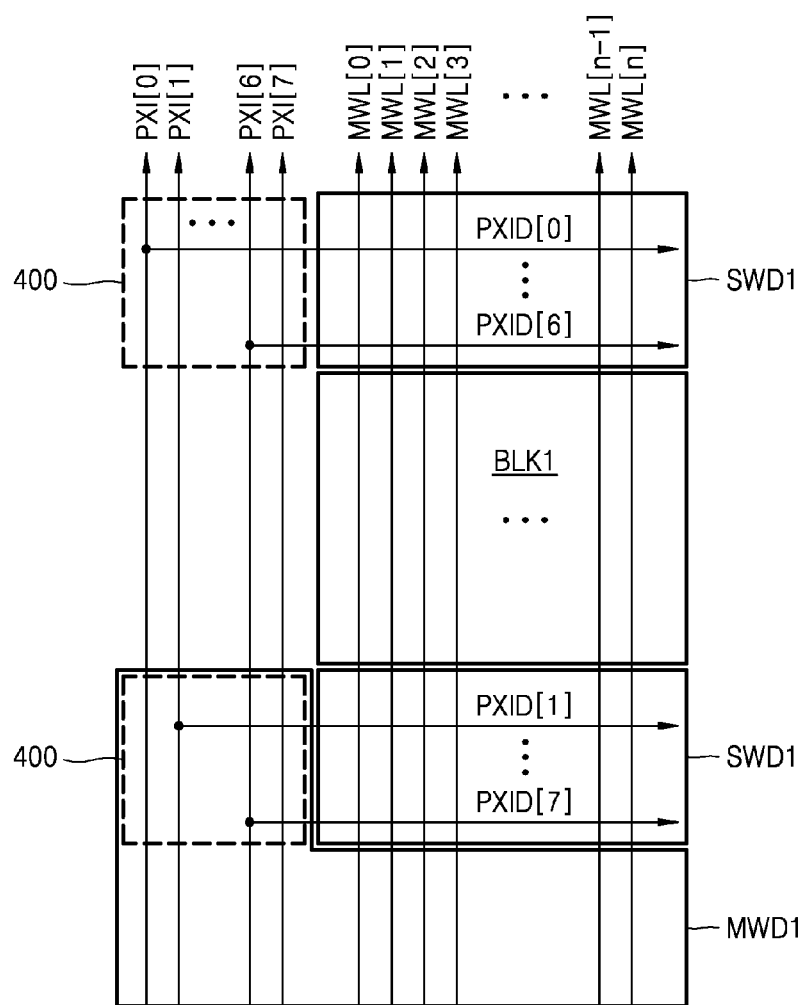

FIGS. 3 and 4 are diagrams for describing a memory bank in FIG. 2. The first through fourth bank arrays 2080a, 2080b, 2080c, and 2080d respectively included in the first through fourth memory banks in FIG. 2 may have the same configuration and thus be collectively named the memory cell array 2080 hereinbelow for convenience of description.

Referring to FIG. 3, the memory cell array 2080 may include a plurality of memory blocks, such as first through i-th memory blocks BLK1 through BLKi, where "i" is an integer greater than one. The memory cell array 2080 may also include first through i-th main word line drivers MWD1 through MWDi respectively connected to the first through i-th memory blocks BLK1 through BLKi and first through i-th sub word line drivers SWD1 through SWDi respectively connected to the first through i-th memory blocks BLK1 through BLKi. Each of the first through i-th sub word line drivers SWD1 through SWDi respectively connected to the first through i-th main word line drivers MWD1 through MWDi may include a plurality of sub word line drivers (in FIG. 6). The first through i-th main word line drivers MWD1 through MWDi may be connected to the row decoder 2060. The first through i-th main word line drivers MWD1 through MWDi may have the same configuration, and the first through i-th sub word line drivers SWD1 through SWDi may have the same configuration.

FIG. 4 shows the arrangement of the first memory block BLK1 as a representative of the first through i-th memory blocks BLK1 through BLKi in FIG. 3. The arrangement of the first memory block BLK1 may also be applied to the other memory blocks, i.e., the second through i-th memory blocks BLK2 through BLKi.

Referring to FIG. 4, sub word line driving signals PXID<0:7> may be arranged above and below the first memory block BLK1 in the row direction of the first memory block BLK1, and main word line driving signals MWL<0:n> may be arranged across the first memory block BLK1 in the column direction of the first memory block BLK1. Among the sub word line driving signals PXID<0:7>, even-numbered sub word line driving signals PXID[0], PXID[2], PXID[4], and PXID[6] may be arranged above the first memory block BLK1 in the row direction, and odd-numbered sub word line driving signals PXID[1], PXID[3], PXID[5], and PXID[7] may be arranged below the first memory block BLK1 in the row direction. According to an embodiment, the even-numbered sub word line driving signals PXID[0], PXID[2], PXID[4], and PXID[6] may be arranged below the first memory block BLK1 in the row direction, and the odd-numbered sub word line driving signals PXID[1], PXID[3], PXID[5], and PXID[7] may be arranged above the first memory block BLK1 in the row direction.

The sub word line driving signals PXID<0:7> may be provided from the first sub word line driver SWD1, the main word line driving signals MWL<0:n> may be provided from the first main word line driver MWD1. For example, the first sub word line driver SWD1 may be located above and below the first memory block BLK1, and the first main word line driver MWD1 may be located adjacent to the first sub word line driver SWD1 below the first memory block BLK1. According to an embodiment, the first main word line driver MWD1 may be located adjacent to the first sub word line driver SWD1 above the first memory block BLK1.

Figure 5:
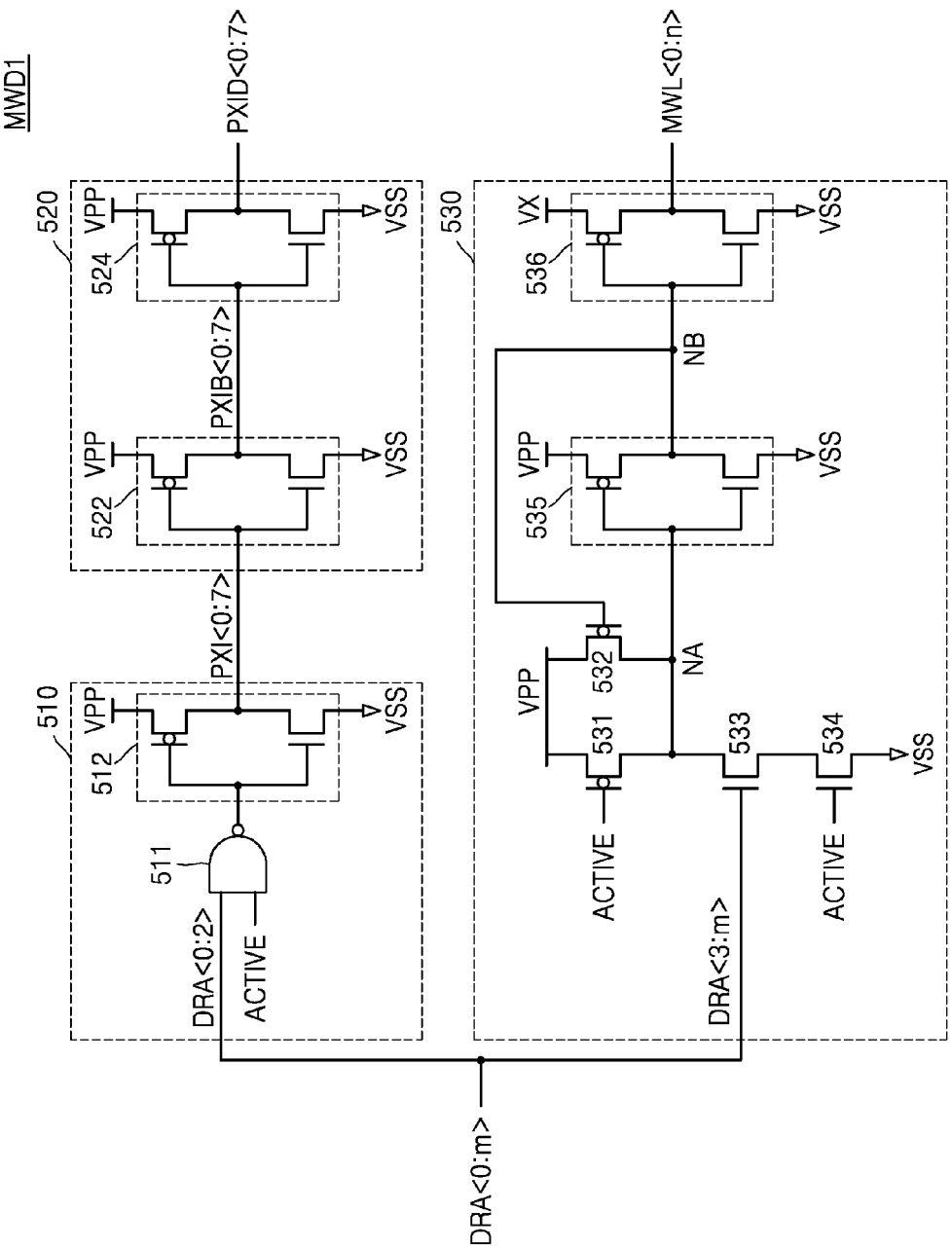
FIG. 5 is a circuit diagram of a main word line driver in FIG. 4.

FIG. 5 is a circuit diagram of the first main word line driver MWD1 in FIG. 4. The circuit diagram of the first main word line driver MWD1 of FIG. 5 may also be applied to the other main word line drivers, i.e., the second through i-th main word line drivers MWD2 through MWDi, in FIG. 3. Referring to FIG. 5, the first main word line driver MWD1 may include a sub word line signal generator circuit 510, a sub word line driving signal generator circuit 520, and a main word line driving signal generator circuit 530.

The sub word line signal generator circuit 510 may be driven with the high voltage VPP and a ground voltage VSS and may include a NAND gate 511 and an inverter 512. The NAND gate 511 may receive an active signal ACTIVE and first decoded row address signals DRA<0:2> and provide an output to the inverter 512. According to an output of the inverter 512, sub word line signals PXI<0:7> corresponding to the first decoded row address signals DRA<0:2> may be activated.

The active signal ACTIVE is a control signal indicating that a memory block selected from the first through i-th memory blocks BLK1 through BLKi is in an active mode and may be provided from the control logic 2010 based on an active command. The active signal ACTIVE may be provided at a logic high level when the selected memory block is in the active mode and may be provided at a logic low level when the selected memory block is in a standby mode. The first decoded row address signals DRA<0:2> are obtained by decoding the lower three bits in the row address ROW_ADDR of the memory device 200. There may be eight cases, i.e., 000, 001, 010, 011, 100, 101, 110, and 111, for the first decoded row address signals DRA<0:2>, and accordingly, the sub word line signals PXI<0:7> that are activated may also be eight. In other words, according to the first decoded row address signals DRA<0:2>, one of the sub word line signals PXI[0], PXI[1], PXI[2], PXI[3], PXI[4], PXI[5], PXI[6], and PXI[7] may be activated. According to an embodiment, the sub word line signal generator circuit 510 may activate sub word line signals PXI<0:3> corresponding to first decoded row address signals having one of four cases (00, 01, 10, and 11) using signals obtained by decoding the lower two bits in the row address ROW_ADDR of the memory device 200.

The sub word line driving signal generator circuit 520 may be driven with the high voltage VPP and the ground voltage VSS and may include a first inverter 522 and a second inverter 524. The sub word line driving signal generator circuit 520 may receive the sub word line signals PXI<0:7>, generate an output of the first inverter 522 as inverted sub word line driving signals PXIB<0:7>, and output an output of the second inverter 524 as the sub word line driving signals PXID<0:7>. The sub word line driving signal generator circuit 520 may be located in a conjunction area (400 in FIG. 4) between memory blocks.

The main word line driving signal generator circuit 530 may receive the active signal ACTIVE and a second decoded row address signal DRA<3:m>, where "m" is an integer of at least 4. In the active mode, the main word line driving signal generator circuit 530 may activate a main word line driving signal, which corresponds to the second decoded row address signal DRA<3:m> among the main word line driving signals MWL<0:n>, to a logic low level corresponding to the level of the ground voltage VSS in response to the second decoded row address signal DRA<3:m>.

The main word line driving signal generator circuit 530 may include first and second P-type metal oxide semiconductor (PMOS) transistors 531 and 532 connected in parallel between a line of the high voltage VPP and a line of a first node NA, first and second N-type MOS (NMOS) transistors 533 and 534 connected in series between the line of the first node NA and a line of the ground voltage VSS, a first inverter 535 having an input connected to the line of the first node NA and an output connected to a line of a second node NB, and a second inverter 536 having an input connected to the line of the second node NB and an output connected to a line of the main word line driving signals MWL<0:n>. The first inverter 535 may be driven with the high voltage VPP and the ground voltage VSS, and the second inverter 536 may be driven with the variable high voltage VX and the ground voltage VSS.

The first PMOS transistor 531 and the second NMOS transistor 534 may operate in response to the active signal ACTIVE, and the first NMOS transistor 533 may operate in response to the second decoded row address signal DRA<3:m>. The second PMOS transistor 532 may operate in response to a signal of the line of the second node NB.

In the case of a memory block in the active mode among the first through i-th memory blocks BLK1 through BLKi, the line of the first node NA is at the level of the ground voltage VSS and the line of the second node NB is at the level of the high voltage VPP according to the active signal ACTIVE at the logic high level and the second decoded row address signal DRA<3:m>. Thus, a main word line driving signal corresponding to the second decoded row address signal DRA<3:m> may be at the level of the ground voltage VSS.

In the case of a memory block in the standby mode among the first through i-th memory blocks BLK1 through BLKi, the line of the first node NA is at the level of the high voltage VPP and the line of the second node NB is at the level of the ground voltage VSS according to the active signal ACTIVE at the logic low level, and accordingly, the main word line driving signals MWL<0:n> may be at the level of the variable high voltage VX.

Figure 6:
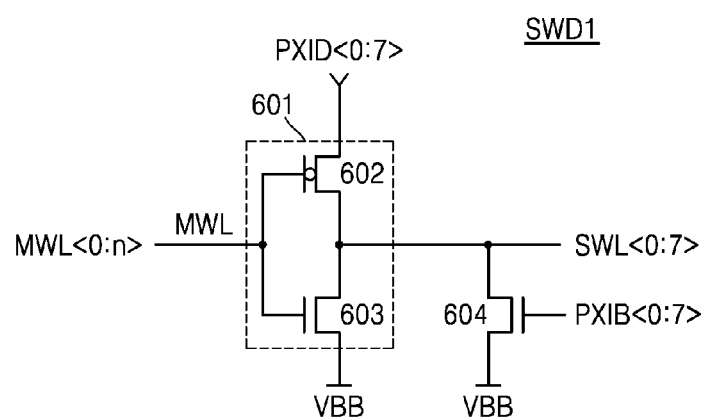
FIG. 6 is a circuit diagram of a sub word line driver in FIG. 4.

FIG. 6 is a circuit diagram of the first sub word line driver SWD1 in FIG. 4. The circuit diagram of the first sub word line driver SWD1 of FIG. 6 may also be applied to the other sub word line drivers, i.e., the second through i-th sub word line drivers SWD2 through SWDi, in FIG. 3.

Referring to FIGS. 5 and 6, the first sub word line driver SWD1 may include an inverter 601, which has an input connected to a main word line driving signal MWL corresponding to the second decoded row address signal DRA<3: m> among the main word line driving signals MWL<0:n> provided from the main word line driving signal generator circuit 530 and an output connected to a sub word line SWL), and an NMOS transistor 604 responding to the inverted sub word line driving signals PXIB<0:7>

The inverter 601 may include a PMOS transistor 602 and an NMOS transistor 603, and each of the main word line driving signals MWL<0:n> may be connected to respective gates of the PMOS transistor 602 and the NMOS transistor 603. The sub word line driving signals PXID<0:7> may be connected to a source of the PMOS transistor 602, the sub word line SWL may be connected to a drain of the PMOS transistor 602, a negative voltage VBB may be connected to a source of the NMOS transistor 603, and the sub word line SWL may be connected to a drain of the NMOS transistor 603. The negative voltage VBB may be connected to a source of the NMOS transistor 604, the inverted sub word line driving signals PXIB<0:7> may be connected to a gate of the NMOS transistor 604, and the sub word line SWL may be connected to a drain of the NMOS transistor 604.

Figure 7:
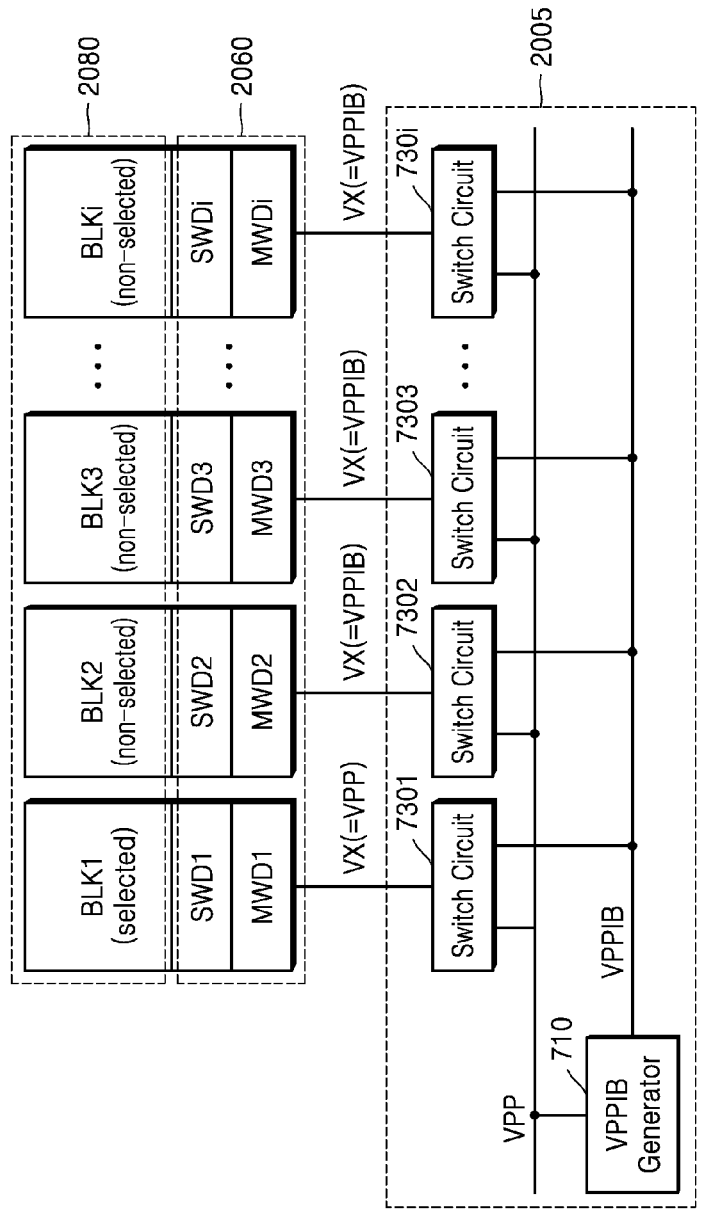
FIGS. 7 through 9 are diagrams for describing a voltage generator circuitry according to embodiments.
Figure 8:
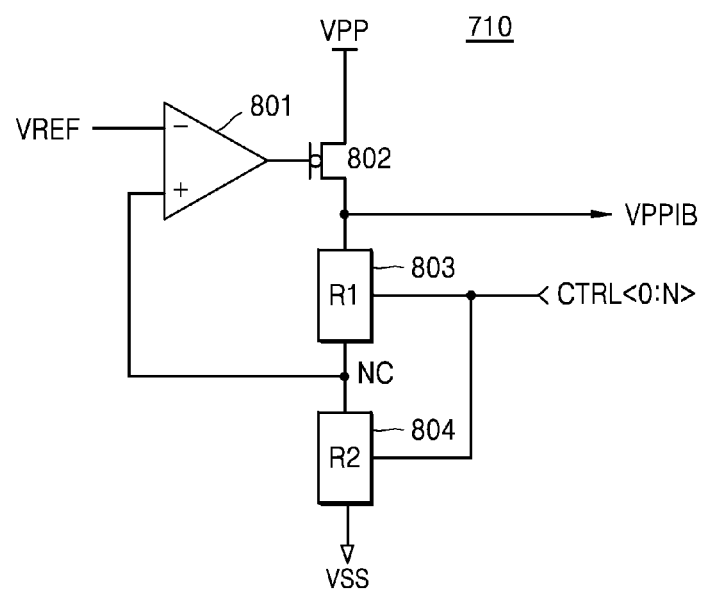
Figure 9:
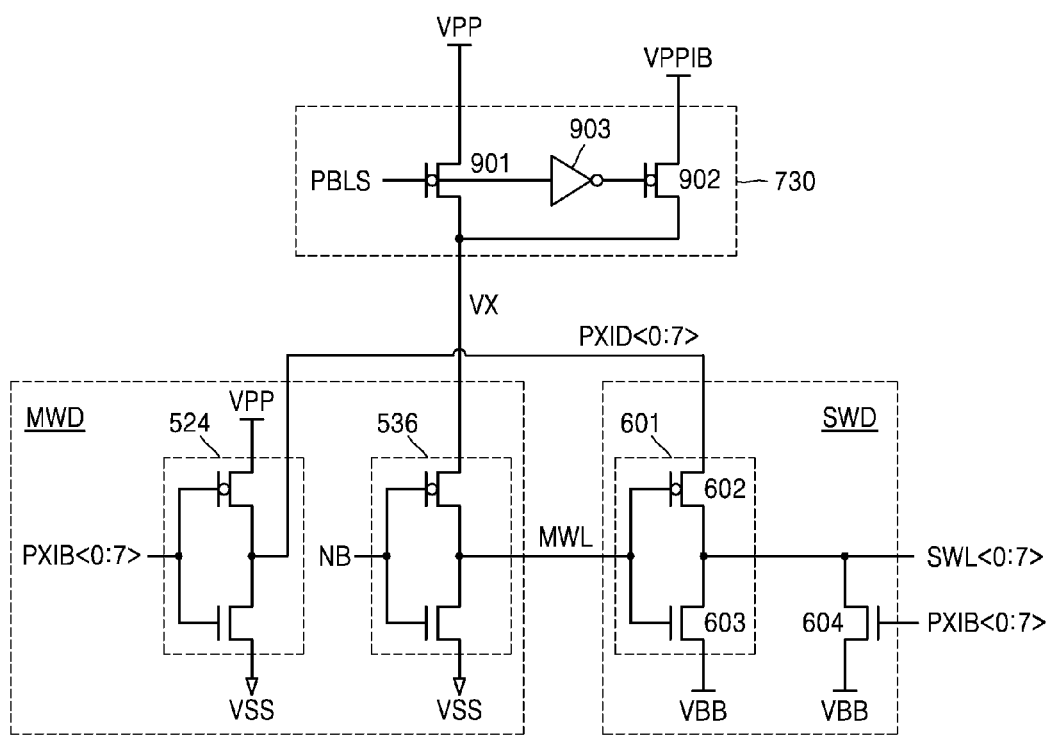

FIGS. 7 through 9 are diagrams for describing voltage generator circuitry according to embodiments of the invention. Referring to FIG. 7, the voltage generator circuitry 2005 may generate and provide the variable high voltage VX to the first through i-th main word line drivers MWD1 through MWDi respectively connected to the first through i-th memory blocks BLK1 through BLKi. The voltage generator circuitry 2005 may provide the variable high voltage VX having the level of the high voltage VPP to a main word line driver of a memory block, which is in the active mode, and provide the variable high voltage VX having the level of the lower high voltage VPPIB to a main word line driver of a memory block, which is in the standby mode. For simplification of the drawings, a memory block in the active mode is denoted by the term "selected" and a memory bloc in the standby mode is denoted by the term "non-selected". For example, the first memory block BLK1 is described as a selected memory block and the other memory blocks, including the second through i-th memory blocks BLK2 through BLKi, are described as non-selected memory blocks.

Referring to FIG. 7, the voltage generator circuitry 2005 may include a lower high voltage generator 710, which generates the lower high voltage VPPIB having a lower level than the high voltage VPP from the high voltage VPP, and a plurality of switch circuits 7301 through 730i. The switch circuits 7301 through 730i may be respectively connected to the first through i-th main word line drivers MWD1 through MWDi and may provide the variable high voltage VX, which has the level of the high voltage VPP or the level of the lower high voltage VPPIB, to the first through i-th main word line drivers MWD1 through MWDi, respectively. The switch circuits 7301 through 730i have the same configuration and are thus referred to as the switch circuit 730 below for convenience of description.

Referring to FIG. 8, the lower high voltage generator 710 may include a comparator 801, a PMOS transistor 802, a first resistor 803, and a second resistor 804. The comparator 801 may have an inverted input terminal (−) connected to a line of a reference voltage VREF and a non-inverted input terminal (+) connected to a line of a third connection node NC between the first resistor 803 and the second resistor 804. The comparator 801 may compare the level of the reference voltage VREF with a voltage level of the third connection node NC. An output signal line of the comparator 801 may be connected to a gate of the PMOS transistor 802, a source of the PMOS transistor 802 may be connected to a line of the high voltage VPP, and a drain of the PMOS transistor 802 may be connected to a line of the lower high voltage VPPIB.

The first resistor 803 and the second resistor 804 may change a resistance value according to the control code CTRL<0:N> provided from the control code generator 2015 of the control logic 2010 in FIG. 2. In other words, the resistance ratio between the first resistor 803 and the second resistor 804 may be controlled according to the control code CTRL<0:N>.

The lower high voltage generator 710 may generate the lower high voltage VPPIB having different voltage levels in response to the control code CTRL<0:N>, which is differently generated according to the command CMD. The lower high voltage generator 710 may generate the lower high voltage VPPIB having the high voltage level HVL in response to the control code CTRL<0:N> corresponding to a precharge command PRE (in FIG. 11). The lower high voltage generator 710 may generate the lower high voltage VPPIB having the low voltage level LVL in response to the control code CTRL<0:N> corresponding to a self-refresh entry command SRE (in FIG. 11). The lower high voltage generator 710 may generate the lower high voltage VPPIB having the medium voltage level MVL in response to the control code CTRL<0:N> corresponding to a self-refresh exit command SRX (in FIG. 11). The lower high voltage generator 710 may generate the lower high voltage VPPIB having the high voltage level HVL in response to the control code CTRL<0:N> corresponding to an active command ACT (in FIG. 11).

Referring to FIG. 9, the switch circuit 730 may provide the high voltage VPP or the lower high voltage VPPIB as the variable high voltage VX based on a block select signal PBLS. The control logic 2010 may apply the block select signal PBLS such that the block select signal PBLS is applied at a logic low level to a selected memory block and at a logic high level to a non-selected memory block.

The switch circuit 730 may include a first PMOS transistor 901 connected between the line of the high voltage VPP and a line of the variable high voltage VX, a second PMOS transistor 902 connected between the line of the lower high voltage VPPIB and the line of the variable high voltage VX, and an inverter 903 receiving the block select signal PBLS. The block select signal PBLS may be applied to a gate of the first PMOS transistor 901, and an output of the inverter 903 may be applied to a gate of the second PMOS transistor 902.

In the switch circuit 730, which is connected to a selected memory block, e.g., the first memory block BLK1 in FIG. 7, the first PMOS transistor 901 may be turned on in response to the block select signal PBLS at the logic low level, and the high voltage VPP may be provided as the variable high voltage VX. In other words, the variable high voltage VX has the level of the high voltage VPP. At this time, the main word line driving signal MWL corresponding to the second decoded row address signal DRA<3:m> may be at a logic low level in a main word line driver MWD, and a sub word line driver SWD may activate the sub word line SWL according to the sub word line driving signals PXID<0:7> transmitted through the PMOS transistor 602.

In the switch circuit 730, which is connected to non-selected memory blocks, such as the second through i-th memory blocks BLK2 through BLKi in FIG. 7, the second PMOS transistor 902 may be turned on in response to the block select signal PBLS at the logic high level, and the lower high voltage VPPIB may be provided as the variable high voltage VX. In other words, the variable high voltage VX has the level of the lower high voltage VPPIB. At this time, the main word line driving signal MWL may be at a logic high level corresponding to the level of the variable high voltage VX in response to the active signal ACTIVE at the logic low level in the main word line driver MWD, and the sub word line driver SWD may deactivate the sub word line SWL to the level of the ground voltage VSS through the NMOS transistor 603.

At this time, the main word line driving signal MWL at the level of the variable high voltage VX is applied to the gate of the PMOS transistor 602 of the sub word line driver SWD, and the PMOS transistor 602 is turned off. The level of the variable high voltage VX is the level of the lower high voltage VPPIB that is lower than the high voltage VPP. When the lower high voltage VPPIB is applied to the gate of the PMOS transistor 602, a depletion region is formed around the channel of the PMOS transistor 602. When the high voltage VPP instead of the lower high voltage VPPIB is applied to the gate of the PMOS transistor 602, the depletion region around the channel of the PMOS transistor 602 gradually disappears, and stress such as a strong electric field may be applied to the gate of the PMOS transistor 602. Similarly, stress such as a strong electric field may also be applied to the gate of the NMOS transistor 603 of the sub word line driver SWD. Accordingly, the characteristics of the PMOS and NMOS transistors 602 and 603 may change, and the reliability of the sub word line driver SWD may decrease. However, in the present embodiment, the lower high voltage VPPIB having the lower level than the high voltage VPP is applied to the gates of the PMOS and NMOS transistors 602 and 603 to thereby reduce the stress on the gates of the PMOS and NMOS transistors 602 and 603 and increase the reliability of the sub word line driver SWD.

Figure 10:
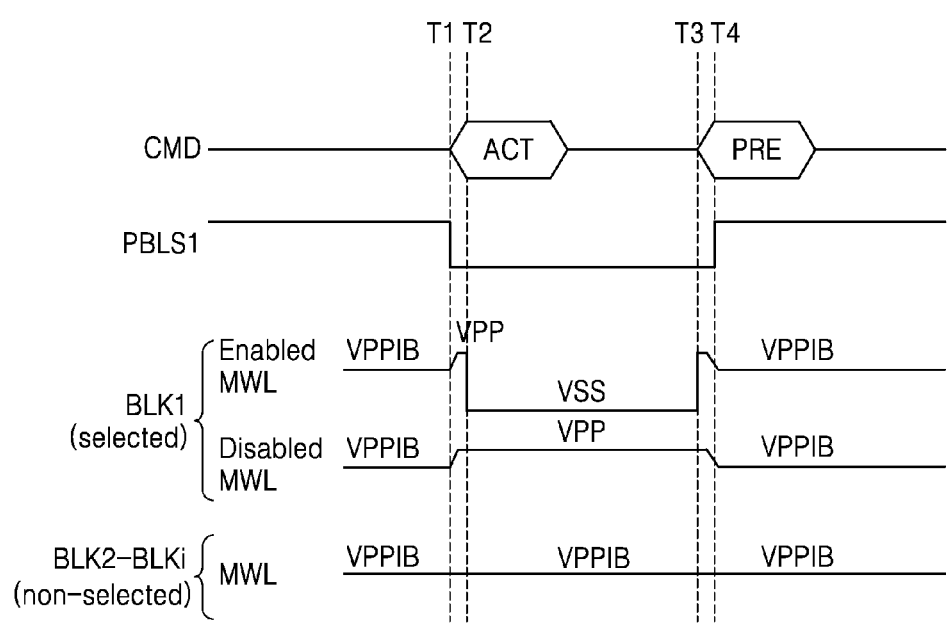
FIGS. 10 and 11 are timing diagrams for describing operations of a voltage generator circuitry, according to embodiments.
Figure 11:
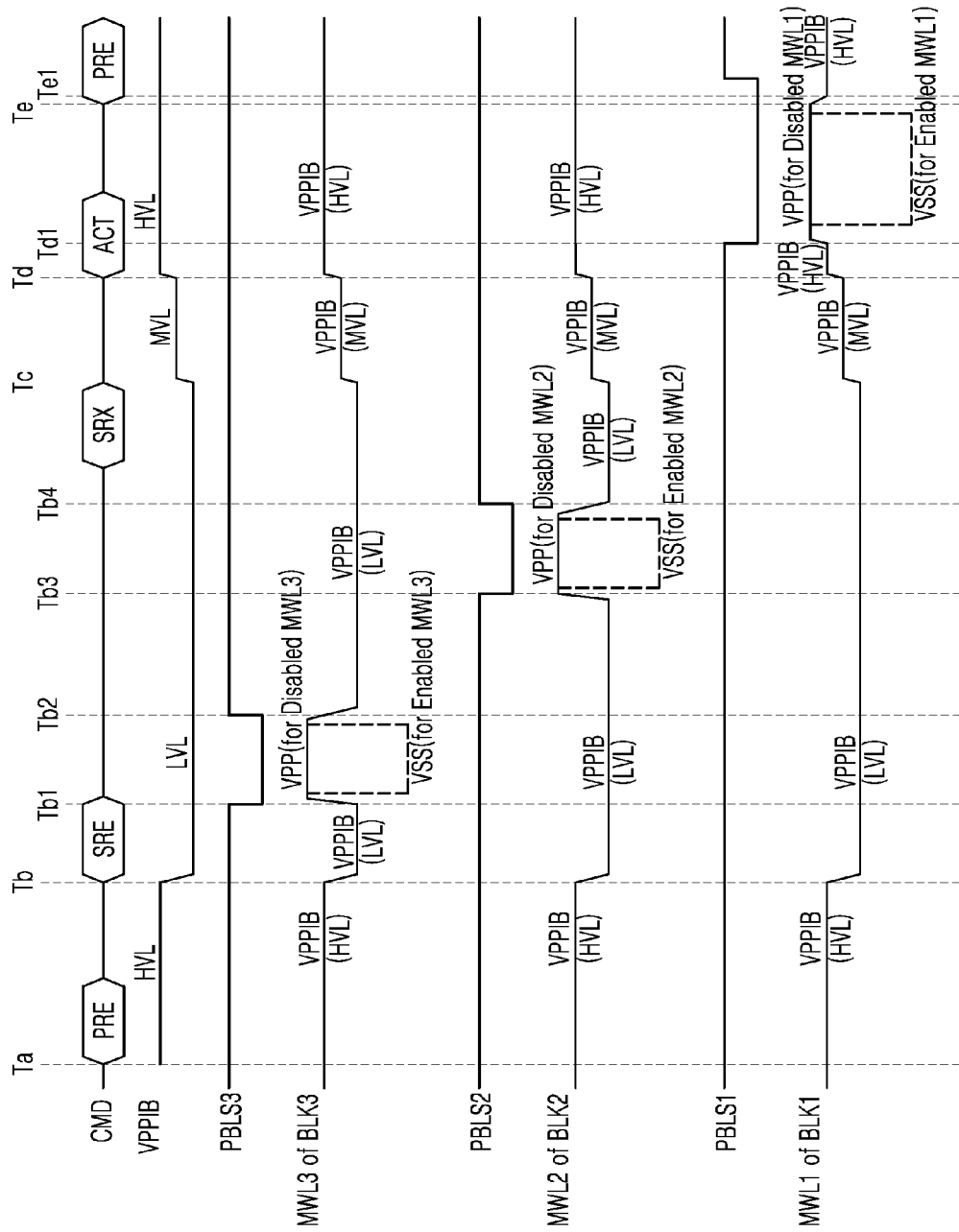

FIGS. 10 and 11 are timing diagrams for describing the operations of a voltage generator circuitry, according to embodiments. It will be noted that the accompanying timing diagrams are not necessarily illustrated on a certain scale. FIG. 10 shows the voltage levels of the main word line driving signal MWL, which is enabled or disabled by the first main word line driver MWD1 connected to the selected memory block, i.e., the first memory block BLK1 described in FIG. 7, and the voltage levels of the main word line driving signal MWL, which is output from each of the second through i-th main word line drivers MWD2 through MWDi respectively connected to the other non-selected memory blocks, i.e., the second through i-th memory blocks BLK2 through BLKi. The main word line driving signal MWL is applied to the gate of the PMOS transistor 602 of the sub word line driver SWD.

Referring to FIG. 2 and FIGS. 5 through 10, the memory device 200 may receive the active command ACT at a time point T1. The memory device 200 may also receive the address ADDR together with the active command ACT. The address ADDR may include a first block select signal PBLS1 which addresses the first memory block BLK1. It is assumed that the memory device 200 is in the standby mode before the time point T1. In the standby mode, the main word line driving signal MWL of each of the first through i-th memory blocks BLK1 through BLKi may be at the level of the lower high voltage VPPIB.

At the time point T1, the first block select signal PBLS1 selecting the first memory block BLK1 may be activated to a logic low level based on the address ADDR and also provided to the voltage generator circuitry 2005. The control logic 2010 may provide the active signal ACTIVE and the control code CTRL<0:N>, which are generated in response to the active command ACT, to the voltage generator circuitry 2005. The switch circuit 730 connected to the selected memory block, such as the first memory block BLK1, may provide the high voltage VPP as the variable high voltage VX in response to the first block select signal PBLS1. The main word line driving signal MWL, which is enabled or disabled in the selected memory block, such as the first memory block BLK1, may rise from the level of the lower high voltage VPPIB to the level of the high voltage VPP.

At a time point T2, the main word line driving signal MWL may be activated or enabled in the selected memory block, such as the first memory block BLK1, in response to the active signal ACTIVE at the logic high level and the second decoded row address signal DRA<3:m>. The second decoded row address signal DRA<3:m> may be delayed. The main word line driving signal MWL that is enabled may decrease from the level of the high voltage VPP to the level of the ground voltage VSS, and the main word line driving signal MWL that is disabled may maintain the level of the high voltage VPP. The main word line driving signal MWL of each of the non-selected memory blocks, such as the second through i-th memory blocks BLK2 through BLKi, may maintain the level of the lower high voltage VPPIB.

At a time point T3, the memory device 200 may receive the precharge command PRE. The precharge command PRE may instruct the memory device 200 to operate in the standby mode. In response to the precharge command PRE, the active signal ACTIVE may be provided at the logic low level. In the standby mode, block select signals PBLS respectively selecting the first through i-th memory blocks BLK1 through BLKi are deactivated, and accordingly, the first block select signal PBLS1 is deactivated to the logic high level.

In the selected memory block, i.e., the first memory block BLK1, the main word line driving signal MWL that is enabled rises to the level of the high voltage VPP before being changed from the level of the ground voltage VSS to the level of the lower high voltage VPPIB at a time point T4. This may be because the second inverter 536 of the first main word line driver MWD1 has been driven to the variable high voltage VX having the level of the high voltage VPP in response to the active signal ACTIVE at the logic low level before the switch circuit 730 changes the variable high voltage VX from the level of the high voltage VPP to the level of the lower high voltage VPPIB in response to the first block select signal PBLS1 at the logic high level. In other words, it may be because the block select signal PBLS generated based on the address ADDR has longer latency than the active signal ACTIVE generated at the logic low level in response to the precharge command PRE. In the selected memory block, i.e., the first memory block BLK1, the main word line driving signal MWL that is disabled may drop from the level of the high voltage VPP to the level of the lower high voltage VPPIB.

At the time point T4, the switch circuit 730 may provide the variable high voltage VX at the level of the lower high voltage VPPIB for the first through i-th main word line drivers MWD1 through MWDi respectively connected to all memory blocks, i.e., the first through i-th memory blocks BLK1 through BLKi. Accordingly, the main word line driving signal MWL that is enabled or disabled in the selected memory block, i.e., the first memory block BLK1, may drop from the level of the high voltage VPP to the level of the lower high voltage VPPIB. The main word line driving signal MWL of each of the non-selected memory blocks, i.e., the second through i-th memory blocks BLK2 through BLKi, may maintain the level of the lower high voltage VPPIB.

FIG. 11 shows the operations of the voltage generator circuitry 2005, in which the level of the lower high voltage VPPIB provided at the variable high voltage VX is changed according to the command CMD applied to the memory device 200 of FIG. 2. For the brevity of the drawings and convenience of description, FIG. 11 conceptually illustrates a third block select signal PBLS3 selecting the third memory block BLK3 and a third main word line driving signal MWL3 that is enabled (marked with a dashed line) and disabled (marked with a solid line) in the third memory block BLK3. Also, FIG. 11 conceptually illustrates a second block select signal PBLS2 selecting the second memory block BLK2, a second main word line driving signal MWL2 that is enabled (marked with a dashed line) and disabled (marked with a solid line) in the second memory block BLK2, the first block select signal PBLS1 selecting the first memory block BLK1, and a first main word line driving signal MWL1 that is enabled (marked with a dashed line) and disabled (marked with a solid line) in the first memory block BLK1.

Referring to FIG. 11, the lower high voltage VPPIB may have the low voltage level LVL, the medium voltage level MVL, and the high voltage level HVL. The low voltage level LVL is the lowest level of the lower high voltage VPPIB, the high voltage level HVL is the highest level of the lower high voltage VPPIB, and the medium voltage level MVL is between the low voltage level LVL and the high voltage level HVL. The high voltage level HVL of the lower high voltage VPPIB may be set to be a little lower than the level of the high voltage VPP.

For example, when the level of the high voltage VPP is set to about 3.0 V, the low voltage level LVL of the lower high voltage VPPIB may be designed to be about 2.5 V, the medium voltage level MVL of the lower high voltage VPPIB may be designed to be about 2.6 V, and the high voltage level HVL of the lower high voltage VPPIB may be designed to be about 2.8 V. Although the lower high voltage VPPIB has three voltage levels (i.e., LVL, MVL, and HVL) in the present embodiment, this is just an example, and other embodiments are not limited thereto. According to embodiments, the level of the lower high voltage VPPIB may be variously configured.

Referring to FIG. 11, the voltage generator circuitry 2005 may generate the lower high voltage VPPIB at the high voltage level HVL in response to the precharge command PRE at time points Ta and Te. The voltage generator circuitry 2005 may generate the lower high voltage VPPIB at the low voltage level LVL in response to the self-refresh entry command SRE at a time point Tb, generate the lower high voltage VPPIB at the medium voltage level MVL in response to the self-refresh exit command SRX at a time point Tc, and generate the lower high voltage VPPIB at the high voltage level HVL in response to the active command ACT at a time point Td.

Referring to FIGS. 2, 5 through 9, and 11, the memory device 200 may receive the precharge command PRE at the time point Ta. The memory device 200 may operate in the standby mode in response to the precharge command PRE. In the standby mode, the lower high voltage VPPIB at the high voltage level HVL may be provided for the first main word line driving signal MWL1 of the first memory block BLK1, the second main word line driving signal MWL2 of the second memory block BLK2, and the third main word line driving signal MWL3 of the third memory block BLK3.

At the time point Tb, the memory device 200 may receive the self-refresh entry command SRE. The memory device 200 may operate in a refresh mode in response to the self-refresh entry command SRE. In the refresh mode, the lower high voltage VPPIB may be generated at the low voltage level LVL; and the first main word line driving signal MWL1 of the first memory block BLK1, the second main word line driving signal MWL2 of the second memory block BLK2, and the third main word line driving signal MWL3 of the third memory block BLK3 may have the low voltage level LVL of the lower high voltage VPPIB.

The third block select signal PBLS3 may be activated to the logic low level in a period between time points Tb1 and Tb2. At the time point Tb1, the third main word line driving signal MWL3 (marked with the dashed line) that is enabled in the third memory block BLK3 may rise from the low voltage level LVL of the lower high voltage VPPIB to the level of the high voltage VPP and then drop to the level of the ground voltage VSS due to the delay of the second decoded row address signal DRA<3:m>. At this time, the third main word line driving signal MWL3 of the third memory block BLK3 may be provided to the sub word line driver SWD together with the sub word line driving signals PXID<0:7> to perform a refresh operation. The third main word line driving signal MWL3 (marked with the solid line) that is disabled in the third memory block BLK3 may rise from the low voltage level LVL of the lower high voltage VPPIB to the level of the high voltage VPP.

When the third block select signal PBLS3 is deactivated to the logic high level at the time point Tb2, the third main word line driving signal MWL3 (marked with the dashed line) that is enabled in the third memory block BLK3 may rise from the level of the ground voltage VSS to the level of the high voltage VPP and then drop to the low voltage level LVL of the lower high voltage VPPIB due to the delay of the second decoded row address signal DRA<3:m>. The third main word line driving signal MWL3 (marked with the solid line) that is disabled in the third memory block BLK3 may drop from the level of the high voltage VPP to the low voltage level LVL of the lower high voltage VPPIB.

The second block select signal PBLS2 may be activated to the logic low level in a period between time points Tb3 and Tb4. At the time point Tb3, the second main word line driving signal MWL2 (marked with the dashed line) that is enabled in the second memory block BLK2 may rise from the low voltage level LVL of the lower high voltage VPPIB to the level of the high voltage VPP and then drop to the level of the ground voltage VSS due to the delay of the second decoded row address signal DRA<3:m>. At this time, the second main word line driving signal MWL2 of the second memory block BLK2 may be provided to the sub word line driver SWD together with the sub word line driving signals PXID<0:7> to perform the refresh operation. The second main word line driving signal MWL2 (marked with the solid line) that is disabled in the second memory block BLK2 may rise from the low voltage level LVL of the lower high voltage VPPIB to the level of the high voltage VPP.

When the second block select signal PBLS2 is deactivated to the logic high level at the time point Tb4, the second main word line driving signal MWL2 (marked with the dashed line) that is enabled in the second memory block BLK2 may rise from the level of the ground voltage VSS to the level of the high voltage VPP and then drop to the low voltage level LVL of the lower high voltage VPPIB due to the delay of the second decoded row address signal DRA<3:m>. The second main word line driving signal MWL2 (marked with the solid line) that is disabled in the second memory block BLK2 may drop from the level of the high voltage VPP to the low voltage level LVL of the lower high voltage VPPIB.

Before the time point Tc, the memory device 200 may receive the self-refresh exit command SRX. At the time point Tc, the self-refresh exit command SRX ends, and the memory device 200 may end with the refresh mode. When the refresh mode ends, the lower high voltage VPPIB may be generated at the medium voltage level MVL. Accordingly, the first main word line driving signal MWL1 of the first memory block BLK1, the second main word line driving signal MWL2 of the second memory block BLK2, and the third main word line driving signal MWL3 of the third memory block BLK3 may rise from the low voltage level LVL of the lower high voltage VPPIB to the medium voltage level MVL.

At the time point Td, the memory device 200 may receive the active command ACT. In response to the active command ACT, the memory device 200 may operate in the active mode. In the active mode, the lower high voltage VPPIB may be generated at the high voltage level HVL. Accordingly, the first main word line driving signal MWL1 of the first memory block BLK1, the second main word line driving signal MWL2 of the second memory block BLK2, and the third main word line driving signal MWL3 of the third memory block BLK3 may rise from the medium voltage level MVL of the lower high voltage VPPIB to the high voltage level HVL.

At this time, during a normal operation including a write operation and/or a read operation in the active mode, to fast restore the main word line driving signal MWL to the level of the high voltage VPP, the high voltage level HVL of the lower high voltage VPPIB may be set to be a little lower than the level of the high voltage VPP.

The first block select signal PBLS1 may be activated to the logic low level at a time points Td1. The first main word line driving signal MWL1 (marked with the dashed line) that is enabled in the first memory block BLK1 may rise from the high voltage level HVL of the lower high voltage VPPIB to the level of the high voltage VPP and then drop to the level of the ground voltage VSS due to the delay of the second decoded row address signal DRA<3:m>. At this time, the first main word line driving signal MWL1 of the first memory block BLK1 may be provided to the sub word line driver SWD together with the sub word line driving signals PXID<0:7> to perform the normal operation including the write operation and/or the read operation. The first main word line driving signal MWL1 (marked with the solid line) that is disabled in the first memory block BLK1 may rise from the high voltage level HVL of the lower high voltage VPPIB to the level of the high voltage VPP.

At the time point Te, the memory device 200 may receive the precharge command PRE. In response to the precharge command PRE, the memory device 200 may operate in the standby mode. In the standby mode, the lower high voltage VPPIB may be generated at the high voltage level HVL.

At a time point Te1 in the standby mode, the first main word line driving signal MWL1 (marked with the dashed line) that is enabled in the first memory block BLK1 may rise from the level of the ground voltage VSS to the level of the high voltage VPP and then drop to the high voltage level HVL of the lower high voltage VPPIB the due to the delay of the second decoded row address signal DRA<3:m>. The first main word line driving signal MWL1 (marked with the solid line) that is disabled in the first memory block BLK1 may drop from the level of the high voltage VPP to the high voltage level HVL of the lower high voltage VPPIB. After the time point Te1, the first block select signal PBLS1 may be deactivated to the logic high level.

FIGS. 12 through 15 are diagrams for describing a switch circuit of a voltage generator circuitry, according to embodiments. The switch circuit 730 in FIGS. 12 through 15 will be described focusing on differences from the switch circuit 730 in FIG. 9.

Figure 12:
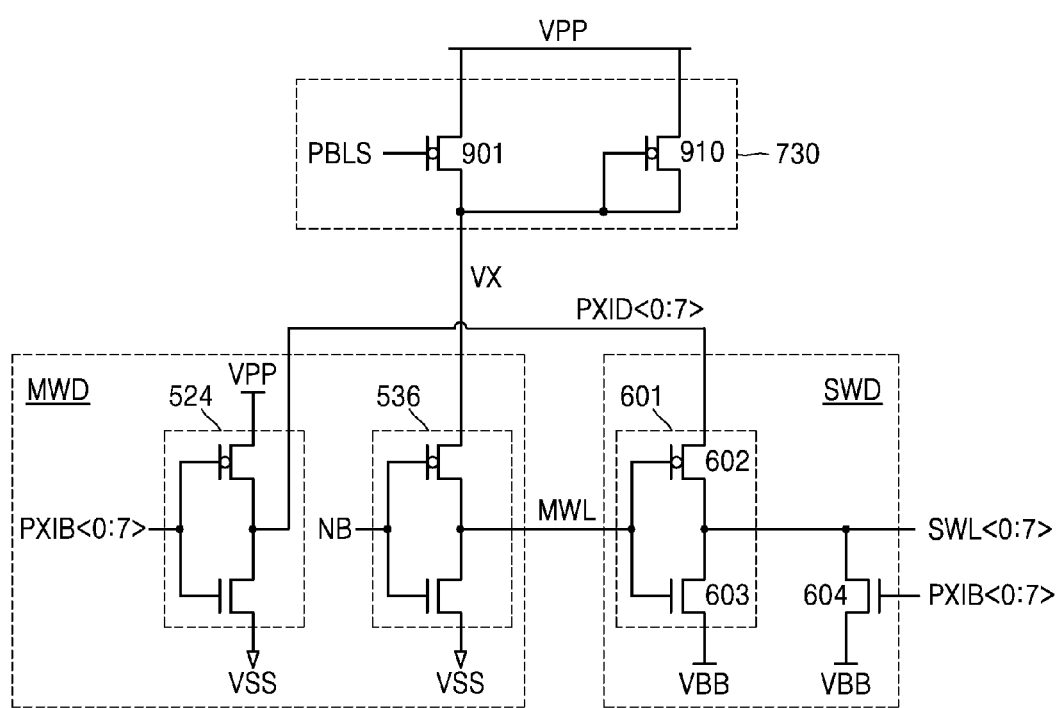
FIGS. 12 through 15 are diagrams for describing switch circuits of a voltage generator circuitry, according to embodiments.

Referring to FIG. 12, the switch circuit 730 may include the first PMOS transistor 901 and a third PMOS transistor 910, which are connected in parallel between the line of the high voltage VPP and the line of the variable high voltage VX. The block select signal PBLS may be connected to the gate of the first PMOS transistor 901, and the line of the variable high voltage VX may be connected to a gate and a drain of the third PMOS transistor 910.

In the switch circuit 730, which is connected to a selected memory block, e.g., the first memory block BLK1 in FIG. 7, the first PMOS transistor 901 may be turned on in response to the block select signal PBLS at the logic low level, and the high voltage VPP may be provided as the variable high voltage VX. The variable high voltage VX has the level of the high voltage VPP.

In the switch circuit 730, which is connected to non-selected memory blocks, e.g., the second through i-th memory blocks BLK2 through BLKi in FIG. 7, the first PMOS transistor 901 may be turned off in response to the block select signal PBLS at the logic high level, and the variable high voltage VX may be provided at a level, which is lower than the high voltage VPP by a threshold voltage (Vth) of the third PMOS transistor 910, via the third PMOS transistor 910 which is a diode type. The variable high voltage VX has the level that is lower than the high voltage VPP by the threshold voltage of the third PMOS transistor 910.

Figure 13:
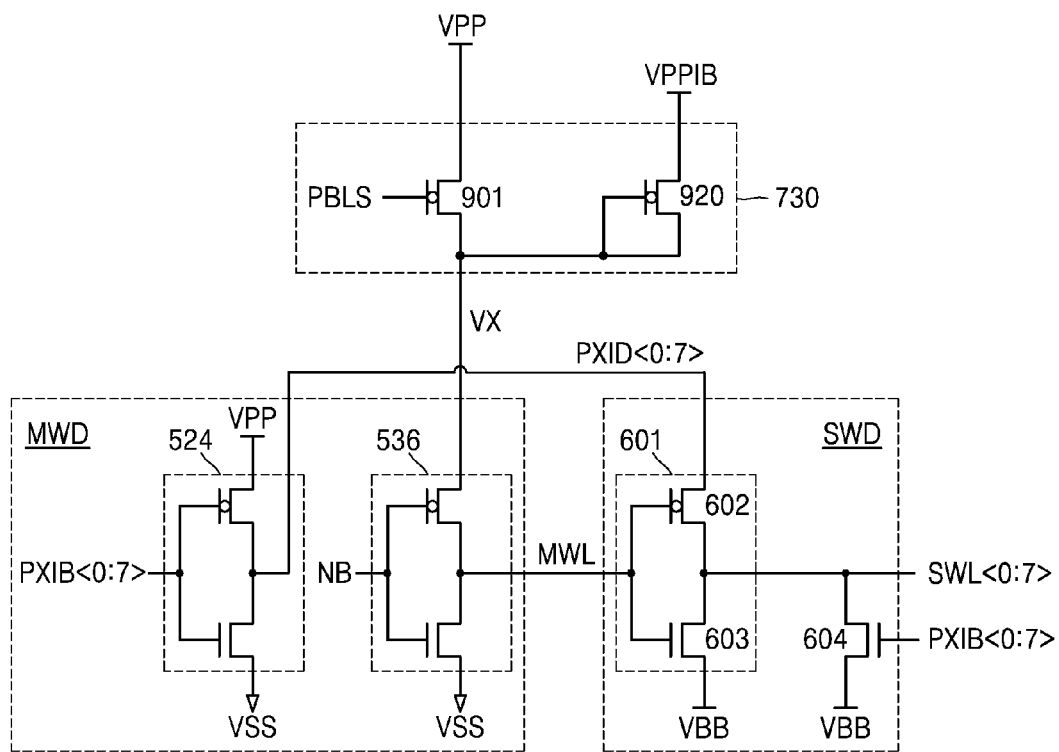

Referring to FIG. 13, the switch circuit 730 may include the first PMOS transistor 901, which is connected between the line of the high voltage VPP and the line of the variable high voltage VX, and a fourth PMOS transistor 920, which is connected between the line of the lower high voltage VPPIB and the line of the variable high voltage VX. The block select signal PBLS may be connected to the gate of the first PMOS transistor 901, and the line of the variable high voltage VX may be connected to a gate and a drain of the fourth PMOS transistor 920.

In the switch circuit 730, which is connected to a selected memory block, e.g., the first memory block BLK1 in FIG. 7, the first PMOS transistor 901 may be turned on in response to the block select signal PBLS at the logic low level, and the high voltage VPP may be provided as the variable high voltage VX. The variable high voltage VX has the level of the high voltage VPP.

In the switch circuit 730, which is connected to non-selected memory blocks, e.g., the second through i-th memory blocks BLK2 through BLKi in FIG. 7, the first PMOS transistor 901 may be turned off in response to the block select signal PBLS at the logic high level, and the variable high voltage VX may be provided at a level, which is lower than the lower high voltage VPPIB by a threshold voltage of the fourth PMOS transistor 920, via the fourth PMOS transistor 920 which is a diode type. The variable high voltage VX has the level that is lower than the lower high voltage VPPIB by the threshold voltage of the fourth PMOS transistor 920.

Figure 14:
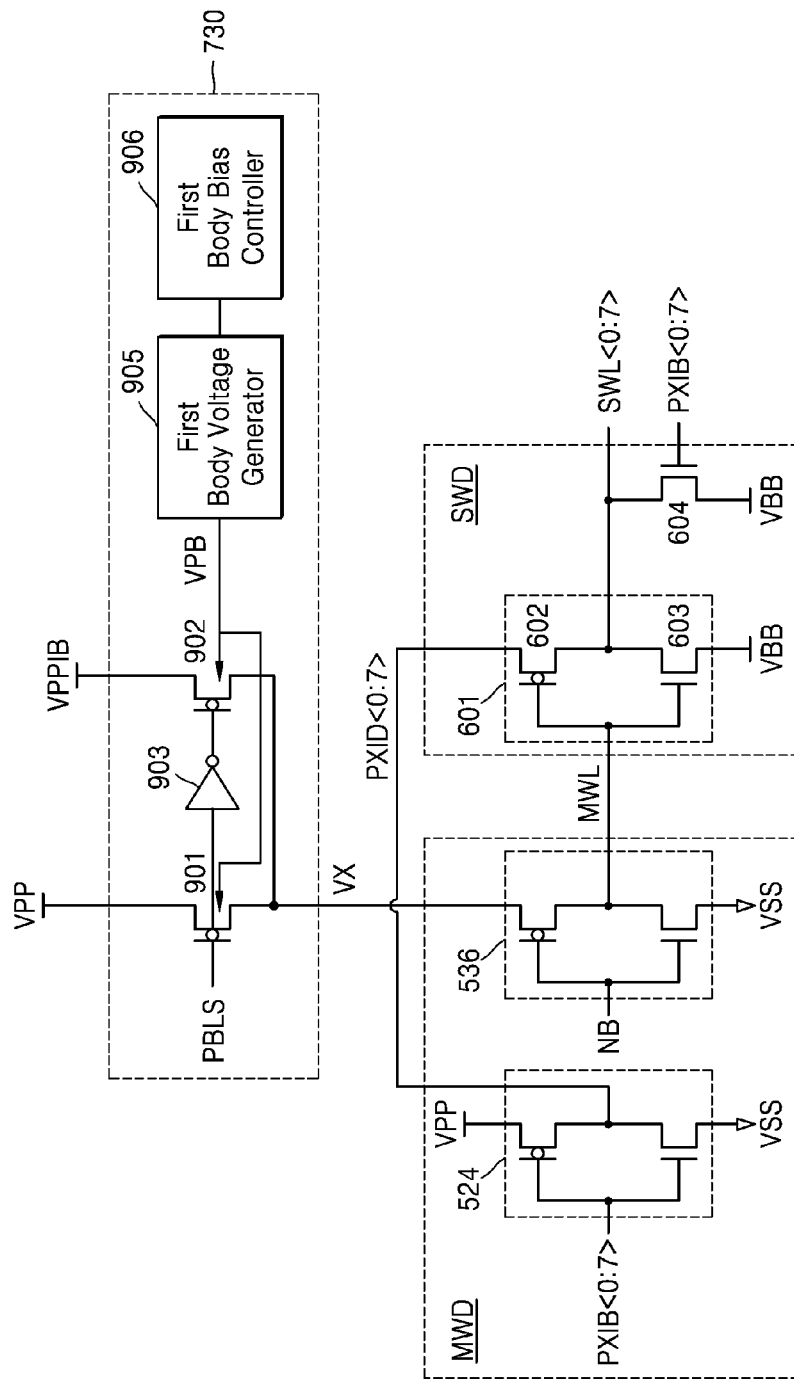

Referring to FIG. 14, the switch circuit 730 may include the first PMOS transistor 901 connected between the line of the high voltage VPP and the line of the variable high voltage VX, the second PMOS transistor 902 connected between the line of the lower high voltage VPPIB and the line of the variable high voltage VX, the inverter 903 receiving the block select signal PBLS, a first body voltage generator 905, and a first body bias controller 906.

The DRAM 200 operates according to the rules of timing parameters such as word line activation timing and precharge timing. With the miniaturization of semiconductor processes, timing parameters get longer and longer, and characteristics, e.g., threshold voltages Vth, may be different between devices due to process, voltage, and temperature (PVT) variations.

The first body voltage generator 905 and the first body bias controller 906 may generate and provide a first bias voltage VPB as a bias voltage of the first and second PMOS transistors 901 and 902 under the control of the control logic 2010 in FIG. 2. The first body voltage generator 905 and the first body bias controller 906 may change the on-resistance of the first and second PMOS transistors 901 and 902 by controlling the threshold voltages Vth of the first and second PMOS transistors 901 and 902. Accordingly, the switch circuit 730 may control the charge and discharge timing of the line of the variable high voltage VX to the high voltage VPP and/or the lower high voltage VPPIB, thereby being useful in satisfying timing requirements of the timing parameters.

Figure 15:
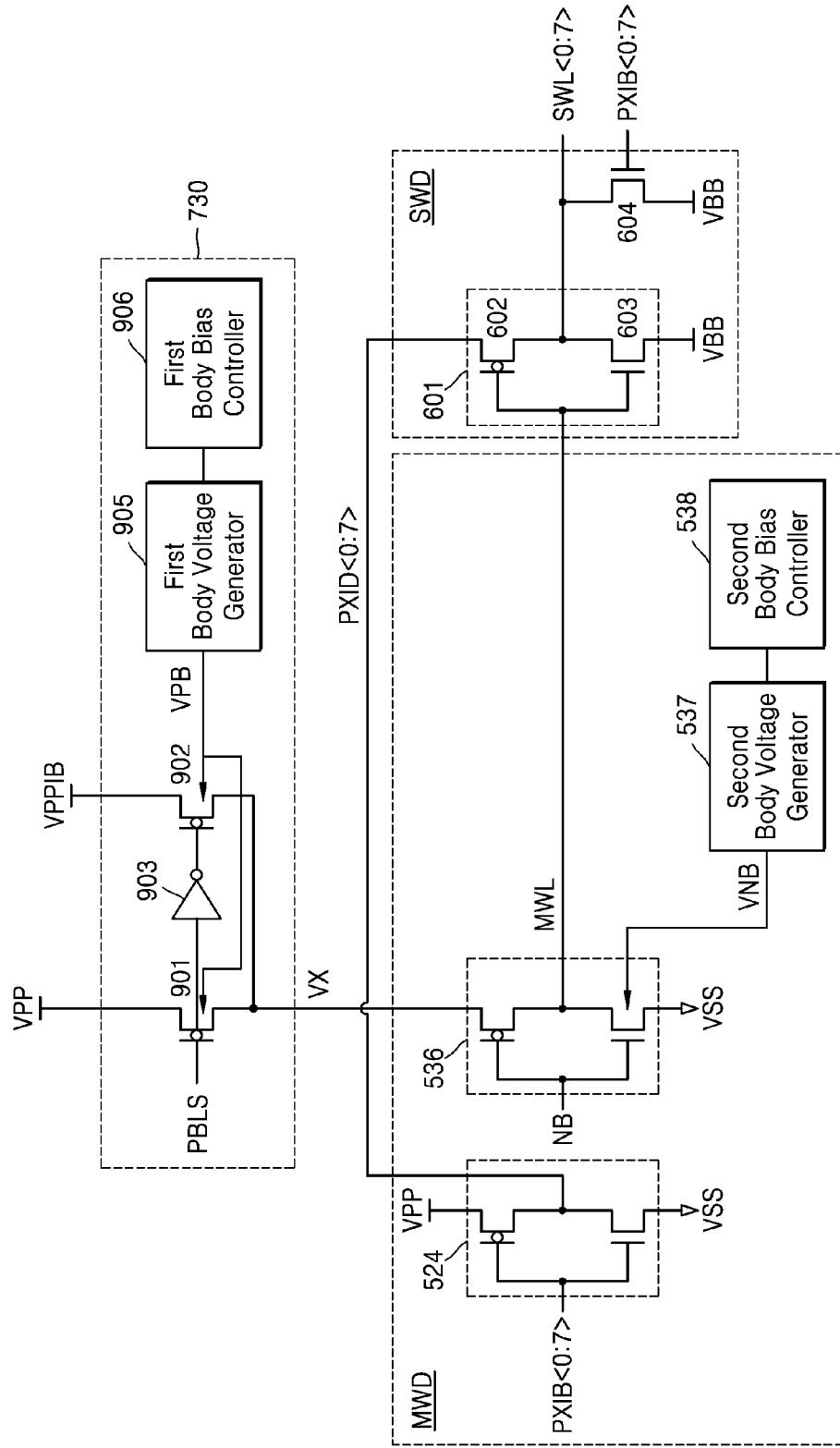

Referring to FIG. 15, the switch circuit 730 may include the first PMOS transistor 901, the second PMOS transistor 902, the inverter 903, the first body voltage generator 905, and the first body bias controller 906, like the switch circuit 730 in FIG. 14. the main word line driver MWD may further include a second body voltage generator 537 and a second body bias controller 538, which generate a second bias voltage VNB provided as a bias voltage of an NMOS transistor of the second inverter 536 outputting the main word line driving signal MWL of the main word line driver MWD.

The second body voltage generator 537 and the second body bias controller 538 may generate and provide the second bias voltage VNB to the NMOS transistor of the second inverter 536 under the control of the control logic 2010 in FIG. 2. The second body voltage generator 537 and the second body bias controller 538 may change on-resistance by controlling the threshold voltage Vth of the NMOS transistor of the second inverter 536. Accordingly, the main word line driver MWD may control the timing of driving the main word line driving signal MWL, thereby being useful in satisfying timing requirements of the timing parameters.

Figure 16:
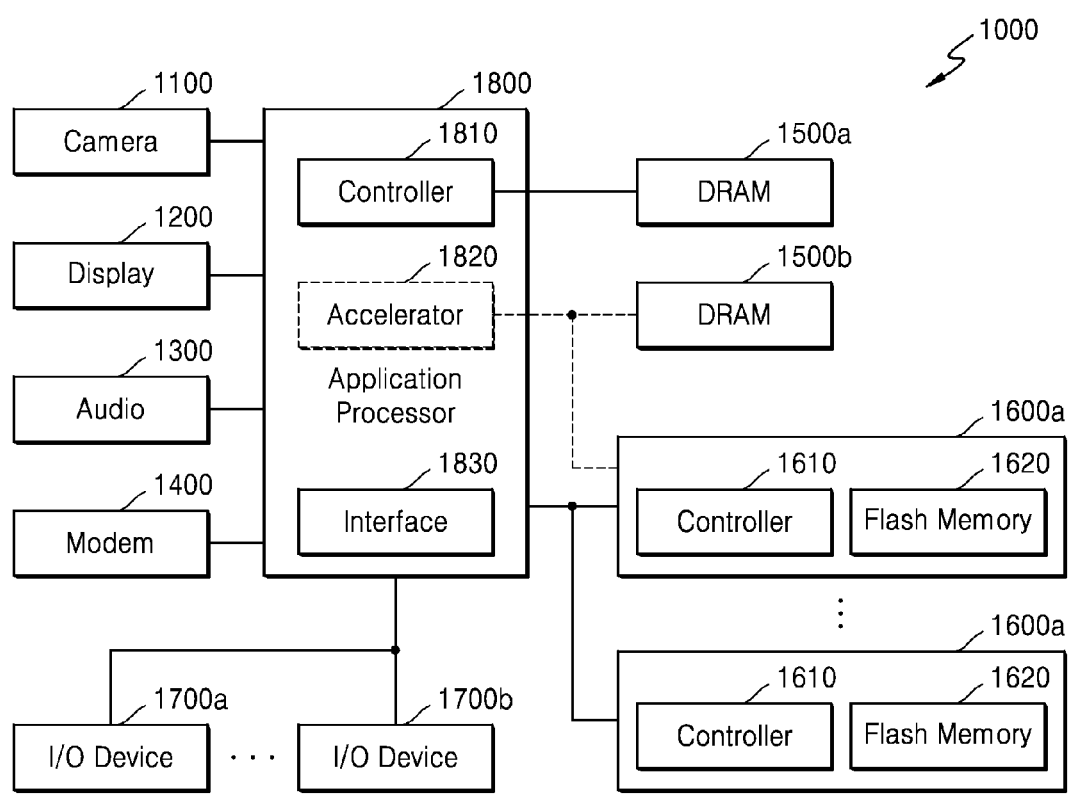
FIG. 16 is a block diagram of a mobile system including a memory device according to embodiments.

FIG. 16 is a block diagram of a mobile system 1000 having applied thereto a memory device according to embodiments. Referring to FIG. 16, the mobile system 1000 may include a camera 1100, a display 1200, an audio processor 1300, a modem 1400, DRAM 1500*a*, DRAM 1500*b*, flash memory devices 1600*a* and 1600*b*, I/O devices 1700*a* and 1700*b*, and an AP 1800. The mobile system 1000 may be implemented as a laptop computer, a mobile phone, a smart phone, a tablet personal computer (PC), a wearable device, a healthcare device, or an internet of things (IOT) device. The mobile system 1000 may be implemented as a server or a PC.

The camera 1100 may shoot a still image or a video under a user's control. There are smart phone applications recognizing the image and/or the video shot by the camera 110, providing relevant information, converting the image into a form of character and storing it, or providing translated text or audio from an image of foreign language, and therefore, the usability of the camera 1100 is increasing.

The display 1200 may be implemented in various forms such as a liquid crystal display (LCD), an organic light-emitting diode (OLED) display, an active-matrix OLED (AM-OLED) display, a plasma display panel (PDP), and so on. In some embodiments, the display 1200 may have a touch screen function and thus be used as an input device of the mobile system 1000.

The audio processor 1300 may process audio data included in the contents of the flash memory devices 1600*a* and 1600*b* or a network. For example, the audio processor 1300 may perform various kinds of processing, such as coding/decoding, amplification, and noise filtering, on audio data.

For wired/wireless data communication, the modem 1400 modulates a signal, transmits a modulated signal, and demodulates a received signal to restore an original signal. The I/O devices 1700*a* and 1700*b* may include devices, such as a universal serial bus (USB) storage, a digital camera, a secure digital (SD) card, a digital versatile disc (DVD), a network adapter, and a touch screen, which provide digital input and/or output functions.

The AP 1800 controls all operations of the mobile system 1000. In detail, the AP 1800 may control the display 1200 to display some of the contents stored in the flash memory devices 1600*a* and 1600*b*. When the AP 1800 receives user input through the I/O devices 1700*a* and 1700*b*, the AP 1800 may perform a control operation corresponding to the user input.

The AP 1800 may be provided as a system-on-chip (SoC) that runs an application program, an operation system (OS), or the like. The AP 1800 and other semiconductor components, e.g., the DRAM 1500*a*, flash memory 1620, and/or a memory controller 1610, may be mounted using various types of packaging. For example, the AP 1800 and other semiconductor components may be mounted using packaging such as a package-on-package (PoP), a ball grid array (BGA), a chip scale package (CSP), a system-in-package (SIP), a multi-chip package (MCP), a wafer-level fabricated package (WFP), or a wafer-level processed stack package (WSP). The kernel of an OS run by the AP 1800 may include an I/O scheduler and a device driver controlling the flash memory devices 1600*a* and 1600*b*. The device driver may control the access performance of the flash memory devices 1600*a* and 1600*b* with reference to the number of synchronous queues managed by the I/O scheduler or may control a CPU mode of an SoC, a dynamic voltage and frequency scaling (DVFS) level, or the like.

In an embodiment, the AP 1800 may include an accelerator block, which is a dedicated circuit for artificial intelligence (AI) data operations, or an accelerator chip 1820 may be provided separately from the AP 1800. Accordingly, the DRAM 1500*b* may be additionally mounted on the accelerator block or the accelerator chip 1820. An accelerator is a functional block that specially performs a certain function of the AP 1800 and may include a GPU that is a functional block specially performing graphics data processing, a neural processing unit (NPU) that is a functional block specially performing AI calculation and inference, and a data processing unit (DPU) that is a functional block specially performing data transmission.

According to an embodiment, the mobile system 1000 may include a plurality of DRAMs 1500a and 1500b. In an embodiment, the AP 1800 may include a controller 1810 therein, and therefore, the DRAM 1500a may be directly connected to the AP 1800. The AP 1800 may control the DRAMs 1500a and 1500b through commands and mode register setting (MRS), which comply with Joint Electron Device Engineering Council (JEDEC) standards or may set a DRAM interface protocol and communicate with the DRAMs 1500a and 1500b to use company's unique functions, such as low voltage, high speed, reliability, and a cyclic redundancy check (CRC) function, and/or an error correction code (ECC) function. For example, the AP 1800 may communicate with the DRAM 1500a through an interface, such as LPDDR4 or LPDDR5, complying with the JEDEC standards, and the accelerator block or the accelerator chip 1820 may set a new DRAM interface protocol and communicate with the DRAM 1500b to control the DRAM 1500b, which has a higher bandwidth than the DRAM 1500a for an accelerator.

Although only the DRAMs 1500a and 1500b are illustrated in FIG. 16, embodiments are not limited thereto, and any type of memory, such as phase-change RAM (PRAM), static RAM (SRAM), magnetic RAM (MRAM), resistive RAM (RRAM), ferroelectric RAM (FRAM), or hybrid RAM, which satisfies the requirements of a bandwidth, a response speed, and/or a voltage for the AP 1800 or the accelerator chip 1820, may be used. The DRAMs 1500a and 1500b have relatively less latency and bandwidth than the I/O devices 1700a and 1700b or the flash memory devices 1600a and 1600b. The DRAMs 1500a and 1500b may be initialized when the mobile system 1000 is powered on and may be loaded with an OS and application data to be used as a temporary storage of the OS and the application data or may be used as a space for execution of various kinds of software code.

The four fundamental arithmetic operations, i.e., addition, subtraction, multiplication, and division, vector operations, address operation, or fast Fourier transform (FFT) operations may be performed in the DRAMs 1500a and 1500b. Functions for executions used for inference may also be performed in the DRAMs 1500a and 1500b. At this time, the inference may be performed during a deep learning algorithm using an artificial neural network. The deep learning algorithm may include a training phase, in which a model is trained using various data, and an inference phase, in which data is recognized using the trained model. Examples of the functions used for inference may include a hyperbolic tangent function, a sigmoid function, a rectified linear unit (ReLU) function.

In an embodiment, an image shot by a user through the camera 110 may undergo signal processing and may be stored in the DRAM 1500b, and the accelerator block or the accelerator chip 1820 may perform an AI data operation using data stored in the DRAM 1500b and a function used for inference to recognize the data.

According to an embodiment, the mobile system 1000 may include a plurality of storages or the flash memory devices 1600a and 1600b, which have a larger capacity than the DRAMs 1500a and 1500b.

According to embodiment, the accelerator block or the accelerator chip 1820 may perform a training phase and an AI data operation using the flash memory devices 1600a and 1600b. In an embodiment, the flash memory devices 1600a and 1600b may allow the AP 1800 and/or the accelerator chip 1820 to efficiently perform a training phase and an inference AI data operation using an arithmetic unit included in the memory controller 1610.

In some embodiments, the AP 1800 may include an interface 1830, and accordingly, the flash memory devices 1600a and 1600b may be directly connected to the AP 1800. For example, the AP 1800 may be implemented as an SoC, the flash memory device 1600a may be implemented as a separate chip, and the AP 1800 and the flash memory device 1600a may be integrated into a single package. However, embodiments are not limited thereto, and the flash memory devices 1600a and 1600b may be electrically connected to the mobile system 1000 through a connection.

The flash memory devices 1600a and 1600b may store images shot through the camera 1100 or data received from a data network. For example, the flash memory devices 1600a and 1600b may store augmented and/or virtual reality contents, high definition (HD) contents, or ultra-high definition (UHD) contents.

For example, the DRAMs 1500a and 1500b may correspond to the memory device 200 in FIG. 1. The DRAMs 1500a and 1500b may include the memory cell array 2080, which includes a plurality of memory blocks, and the voltage generator circuitry 2005, which provides the variable high voltage VX to word line drivers driving word lines. In each of the memory blocks, a plurality of memory cells are connected to word lines and bit lines, which are arranged in rows and columns. The voltage generator circuitry 2005 may generate the lower high voltage VPPIB, which has a lower level than the high voltage VPP, based on the high voltage VPP having a higher level than a power supply voltage and may provide the high voltage VPP or the lower high voltage VPPIB to the line of the variable high voltage VX. The voltage generator circuitry 2005 may change the level of the lower high voltage VPPIB based on the command CMD received from the memory device 200. The lower high voltage VPPIB may be changed to the low voltage level LVL, the medium voltage level MVL, or the high voltage level HVL.

While the inventive concept has been particularly shown and described with reference to embodiments thereof, it will be understood that various changes in form and details may be made therein without departing from the spirit and scope of the following claims.

What is claimed is:

1. A memory device, comprising:
a memory cell array having a plurality of memory blocks therein, which are responsive to respective block select signals;
a voltage generator configured to generate a high voltage or a lower high voltage on a variable high voltage line, said high voltage having a magnitude greater than a power supply voltage of the memory device and said lower high voltage having a magnitude less than the high voltage; and
a word line driver circuit electrically coupled to the variable high voltage line, said word line driver circuit configured to respond to an active command by: (i) switching a first word line driving signal line from the high voltage to a ground voltage, (ii) driving a plurality of second word line driving signal lines to the high voltage, and (iii) driving a plurality of third word line driving signal lines at the lower high voltage;

wherein the first word line driving signal line is electrically connected to an enabled one of a plurality of word lines associated with a selected one of the plurality of memory blocks; wherein the second word line driving signal lines are electrically connected to disabled ones of the plurality of word lines; and wherein the third word line driving signal lines are electrically connected to word lines associated with non-selected one of the plurality of memory blocks.

2. The memory device of claim 1, wherein the first word line driving signal line is switched from the lower high voltage to the high voltage and then to the ground voltage in response to the active command; and wherein the voltage generator is further configured to change the magnitude of the lower high voltage responsive to a command.

3. A memory device, comprising:
a memory cell array having a plurality of memory blocks therein, which are responsive to respective block select signals;
a voltage generator configured to generate a high voltage or a lower high voltage on a variable high voltage line, said high voltage having a magnitude greater than a power supply voltage of the memory device and said lower high voltage having a magnitude less than the high voltage; and
a word line driver circuit electrically coupled to the variable high voltage line, said word line driver circuit configured to: (i) drive a first word line driving signal line to a ground voltage, (ii) drive a plurality of second word line driving signal lines to the high voltage, and (iii) drive a plurality of third word line driving signal lines to the lower high voltage;
wherein the first word line driving signal line is electrically connected to an enabled one of a plurality of word lines associated with a selected one of the plurality of memory blocks; wherein the second word line driving signal lines are electrically connected to disabled ones of the plurality of word lines; and wherein the third word line driving signal lines are electrically connected to word lines associated with non-selected one of the plurality of memory blocks; and
wherein the voltage generator is configured to change the magnitude of the lower high voltage between a low voltage level, at least one medium voltage level greater than the low voltage level, and a high voltage level greater than the medium voltage level; responsive to a command.

4. The memory device of claim 3, wherein the at least one medium voltage level includes two medium voltage levels having different magnitudes.

5. The memory device of claim 3, wherein the voltage generator is configured to generate the lower high voltage at the low voltage level in response to a self-refresh entry command.

6. The memory device of claim 3, wherein the voltage generator is configured to generate the lower high voltage at the medium voltage level in response to a self-refresh exit command.

7. The memory device of claim 6, wherein the lower high voltage having a magnitude equal to the medium voltage level is generated at an end of the self-refresh exit command.

8. The memory device of claim 3, wherein the voltage generator is configured to generate the lower high voltage at the high voltage level in response to an active command.

9. The memory device of claim 3, wherein the voltage generator is configured to generate the lower high voltage at the high voltage level in response to a precharge command.

10. The memory device of claim 3, wherein the voltage generator is configured to set the high voltage level to a magnitude that reduces a time taken for the variable high voltage line to be restored from the high voltage level of the lower high voltage to a level of the high voltage.

11. The memory device of claim 1, wherein the voltage generator comprises:
a lower high voltage generator configured to receive the high voltage and generate the lower high voltage from the high voltage; and
a plurality of switch circuits respectively connected to the plurality of memory blocks and controlled by respective block select signals.

12. The memory device of claim 11, wherein the lower high voltage generator comprises:
a P-type metal oxide semiconductor (PMOS) transistor connected between a line of the high voltage and a line of the lower high voltage;
first and second resistors connected in series between the line of the lower high voltage and a line of the ground voltage and configured to change a resistance value thereof in response to a control code generated based on the command; and
a comparator configured to compare a reference voltage level with a voltage level of a connection node between the first and second resistors and to provide an output to a gate of the PMOS transistor.

13. The memory device of claim 11, wherein each of the plurality of switch circuits comprises:
a first P-type metal oxide semiconductor (PMOS) transistor connected between a line of the high voltage and the variable high voltage line and having a gate responsive to a respective block select signal;
an inverter configured to receive the block select signal; and
a second PMOS transistor connected between a line of the lower high voltage and the variable high voltage line and having a gate connected to an output line of the inverter.

14. The memory device of claim 13, wherein each of the plurality of switch circuits is configured to control threshold voltages of the first and second PMOS transistors by applying body bias voltages to the first and second PMOS transistors.

15. A memory device, comprising:
a memory cell array having a plurality of memory blocks therein, which are responsive to respective block select signals;
a voltage generator configured to generate a high voltage or a lower high voltage on a variable high voltage line, said high voltage having a magnitude greater than a power supply voltage of the memory device and said lower high voltage having a magnitude less than the high voltage; and
a word line driver circuit electrically coupled to the variable high voltage line, said word line driver circuit configured to: (i) drive a first word line driving signal line to a ground voltage, (ii) drive a plurality of second word line driving signal lines to the high voltage, and (iii) drive a plurality of third word line driving signal lines to the lower high voltage;
wherein the first word line driving signal line is electrically connected to an enabled one of a plurality of word lines associated with a selected one of the plurality of memory blocks; wherein the second word line driving signal lines are electrically connected to disabled ones of the plurality of word lines; and wherein the third word line driving signal lines are electrically connected to word lines associated with non-selected one of the plurality of memory blocks; and wherein the word line driver circuit is further configured to control threshold voltages of N-type metal oxide semiconductor (NMOS) transistors by applying body bias voltages to the NMOS transistors driving the first through third word line driving signal lines.

16. The memory device of claim 11, wherein each of the plurality of switch circuits includes:
   a first P-type metal oxide semiconductor (PMOS) transistor connected between a line of the high voltage and the variable high voltage line and having a gate responsive to a respective block select signal; and
   a second PMOS transistor connected between a line of the lower high voltage and the variable high voltage line and having a gate and a drain, the gate and the drain being connected to the variable high voltage line.

17. The memory device of claim 1, wherein the first word line driving signal line is switched from the lower high voltage to the high voltage and then to the ground voltage in response to the active command; and wherein the plurality of second word line driving signal lines are switched from the lower high voltage to the high voltage in response to the active command.

* * * * *